(12) United States Patent
Kim et al.

(10) Patent No.: US 12,250,811 B2
(45) Date of Patent: Mar. 11, 2025

(54) SEMICONDUCTOR DEVICE AND MANUFACTURING METHOD OF SEMICONDUCTOR DEVICE

(71) Applicant: SK hynix Inc., Icheon-si (KR)

(72) Inventors: Changhan Kim, Icheon-si (KR); Yun Cheol Han, Icheon-si (KR); Soon Ju Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 63 days.

(21) Appl. No.: 17/464,481

(22) Filed: Sep. 1, 2021

(65) Prior Publication Data

US 2022/0293618 A1 Sep. 15, 2022

(30) Foreign Application Priority Data

Mar. 15, 2021 (KR) .................. 10-2021-0033529

(51) Int. Cl.
| | |
|---|---|
| *H10B 41/27* | (2023.01) |
| *H01L 21/28* | (2006.01) |
| *H01L 29/423* | (2006.01) |
| *H10B 41/35* | (2023.01) |

(52) U.S. Cl.
CPC ........ *H10B 41/27* (2023.02); *H01L 29/40114* (2019.08); *H01L 29/42324* (2013.01); *H10B 41/35* (2023.02)

(58) Field of Classification Search
None
See application file for complete search history.

(56) References Cited

U.S. PATENT DOCUMENTS

| | | | |
|---|---|---|---|
| 8,254,175 B2 | 8/2012 | Higuchi et al. | |
| 10,217,755 B2 | 2/2019 | Kim et al. | |
| 10,593,766 B2 | 3/2020 | Hopkins | |
| 2009/0283817 A1* | 11/2009 | Krishnamohan | ................ H01L 29/66825 257/E21.179 |
| 2012/0025297 A1* | 2/2012 | Takashima | ........ H01L 21/02161 257/E21.423 |
| 2014/0353738 A1* | 12/2014 | Makala | ............... H01L 29/7926 438/264 |
| 2017/0250189 A1* | 8/2017 | Itokawa | ................. H10B 41/41 |
| 2021/0083069 A1* | 3/2021 | Ikeda | .................... H01L 29/518 |

FOREIGN PATENT DOCUMENTS

| | | |
|---|---|---|
| KR | 101849029 B1 | 4/2018 |
| KR | 1020210028759 A | 3/2021 |

* cited by examiner

*Primary Examiner* — Xiaoming Liu
(74) *Attorney, Agent, or Firm* — William Park & Associates Ltd.

(57) ABSTRACT

A semiconductor device may include: a gate structure including insulating layers and control gates, which are alternately stacked; a channel layer penetrating the gate structure; floating gates respectively located between the control gates and the channel layer; first blocking patterns respectively located between the control gates and the floating gates; and a second blocking pattern located between the first blocking patterns and the control gates and between the control gates and the insulating layers, the second blocking pattern including a material with a dielectric constant that is higher than that of the first blocking patterns.

4 Claims, 31 Drawing Sheets

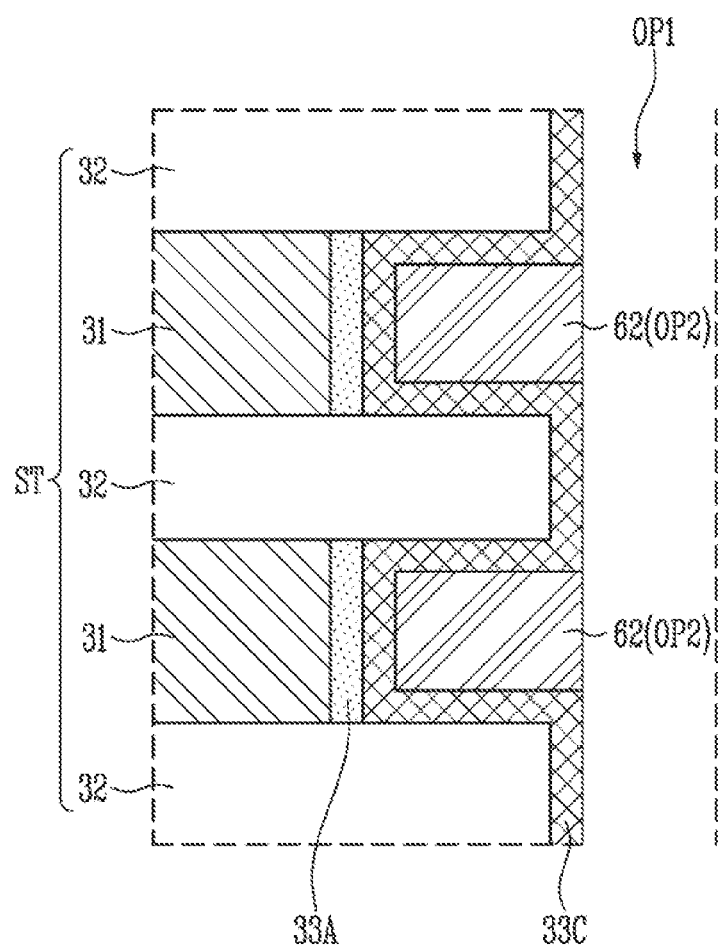

SEMICONDUCTOR DEVICE AND MANUFACTURING METHOD OF SEMICONDUCTOR DEVICE

CROSS-REFERENCE TO RELATED APPLICATION

The present application claims priority under 35 U.S.C. § 119(a) to Korean patent application number 10-2021-0033529 filed on Mar. 15, 2021, in the Korean Intellectual Property Office, the entire disclosure of which is incorporated by reference herein.

BACKGROUND

1. Technical Field

The present disclosure generally relates to an electronic device, and more particularly, to a semiconductor device and a manufacturing method of a semiconductor device.

2. Related Art

The degree of integration of a semiconductor device is mainly determined by an area that is occupied by a unit memory cell. As the improvement of the degree of integration of semiconductor devices in which memory cells are formed in the form of a single layer over a substrate reaches its limit, there has recently been proposed a three-dimensional semiconductor device in which memory cells are stacked over a substrate. Various structures and manufacturing methods have been developed to improve the operational reliability of three-dimensional semiconductor devices.

SUMMARY

In accordance with an aspect of the present disclosure, there is provided a semiconductor device including: a gate structure including insulating layers and control gates, which are alternately stacked; a channel layer penetrating the gate structure; floating gates respectively located between the control gates and the channel layer; first blocking patterns respectively located between the control gates and the floating gates; and a second blocking pattern located between the first blocking patterns and the control gates and between the control gates and the insulating layers, the second blocking pattern including a material with a dielectric constant that is higher than that of the first blocking patterns.

In accordance with another aspect of the present disclosure, there is provided a semiconductor device including: a gate structure including insulating layers and control gates, which are alternately stacked; a channel layer penetrating the gate structure; floating gates respectively located between the control gates and the channel layer; first blocking patterns respectively located between the control gates and the floating gates; and a second blocking pattern located between the first blocking patterns and the floating gates and between the floating gates and the insulating layers, the second blocking pattern including a material with a dielectric constant that is lower than that of the first blocking patterns.

In accordance with still another aspect of the present disclosure, there is provided a method of manufacturing a semiconductor device, the method including: forming a stack structure first material layers and second material layers, which are alternately stacked; forming a first opening penetrating the stack structure; forming second openings between the second material layers; forming first blocking patterns by oxidizing the first material layers exposed through the second openings; respectively forming floating gates in the second openings; forming a channel layer in the first opening; forming third openings by removing the first material layers; forming, in the third openings, a second blocking pattern including a material with a dielectric constant that is higher than that of the first blocking patterns; and respectively forming, in the third openings, control gates surrounded by the second blocking pattern.

In accordance with still another aspect of the present disclosure, there is provided a method of manufacturing a semiconductor device, the method including: forming a stack structure including first material layers and second material layers, which are alternately stacked; forming a first opening penetrating the stack structure; forming second openings by etching the first material layers; respectively forming first blocking patterns in the second openings; forming, in the first opening and the second openings, a second blocking pattern including a material with a dielectric constant that is lower than that of the first blocking patterns; respectively forming, in the second openings, floating gates surrounded by the second blocking pattern; and forming a channel layer in the first opening.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present, Like reference numerals refer to like elements throughout.

FIGS. 3A to 3K are views illustrating a manufacturing method of a semiconductor device in accordance with an embodiment of the present disclosure.

DETAILED DESCRIPTION

The specific structural or functional description disclosed herein is merely illustrative for the purpose of describing embodiments according to the concept of the present disclosure. The embodiments according to the concept of the present disclosure can be implemented in various forms, and cannot be construed as limited to the embodiments set forth herein.

Embodiments provide a semiconductor device with a stable structure and improved characteristics, and a manufacturing method of the semiconductor device.

Figure 1A:
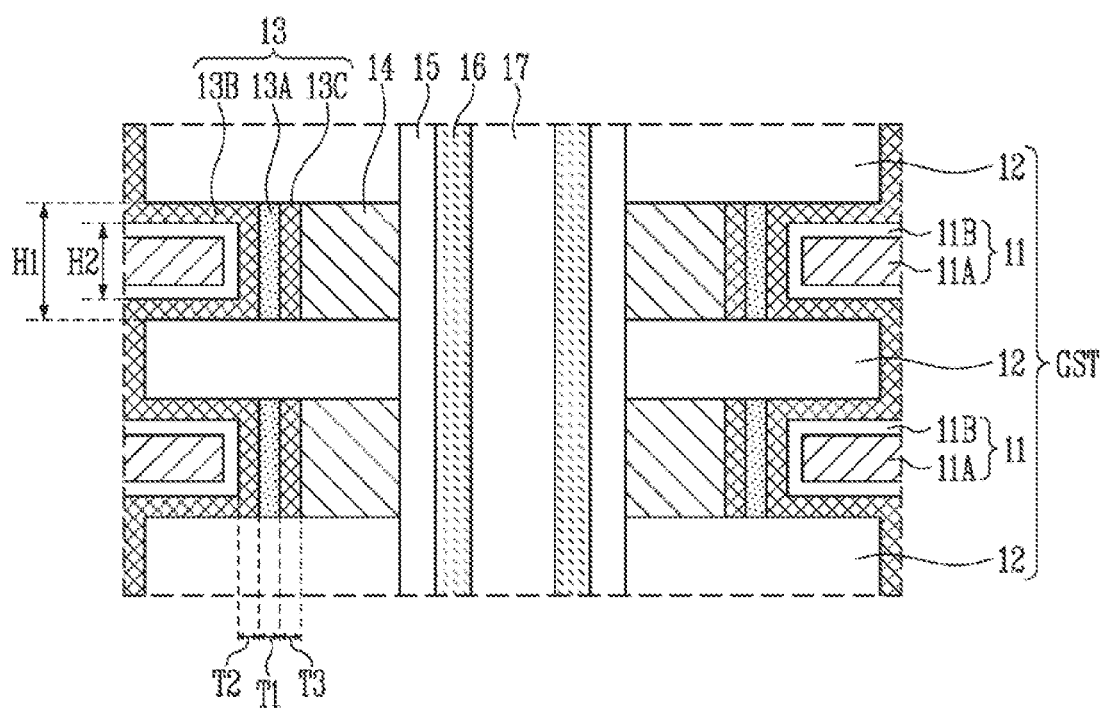
FIGS. 1A and 1B are views illustrating a structure of a semiconductor device in accordance with an embodiment of the present disclosure.
Figure 1B:
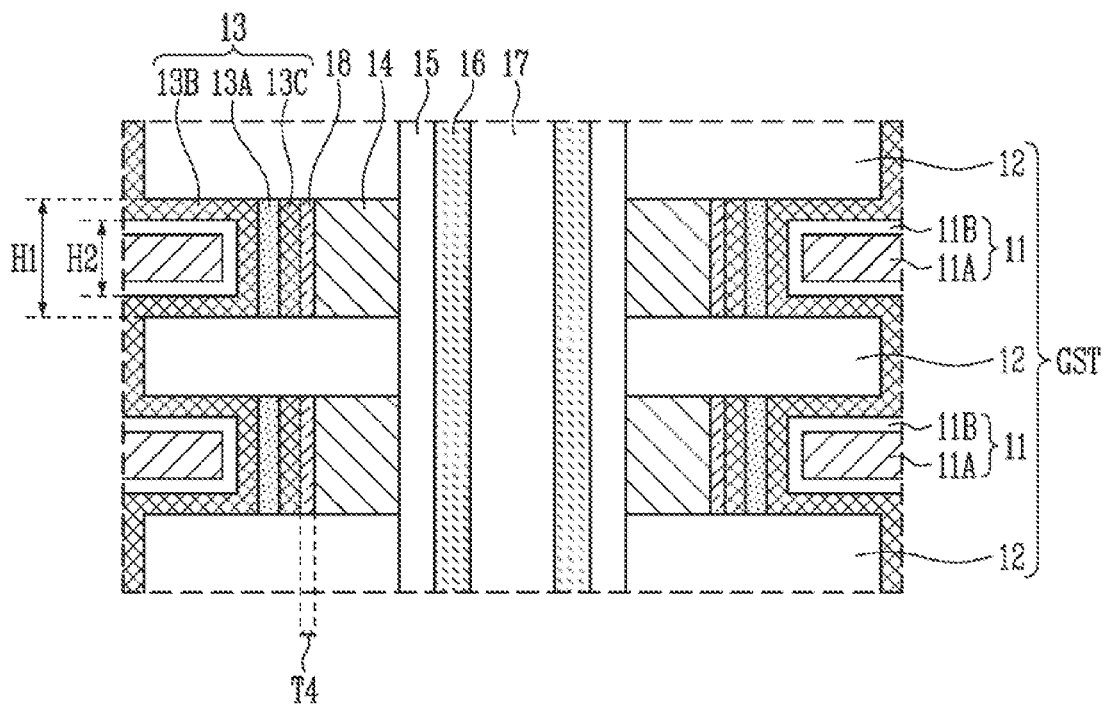

FIGS. 1A and 1B are views illustrating a structure of a semiconductor device in accordance with an embodiment of the present disclosure.

Referring to FIG. 1A, the semiconductor device may include a gate structure GST, a channel layer 16, memory patterns 14, and a blocking layer 13. The semiconductor device may further include a tunnel insulating layer 15, a core 17, or a combination thereof.

The gate structure GST may include conductive layers 11 and insulating layers 12, which are alternately stacked. The conductive layers 11 may be gate electrodes of a memory cell, a select transistor, and the like. In an embodiment, the conductive layers 11 may be control gates. Each of the conductive layers 11 may include a conductive pattern 11A and a barrier pattern 11B. The barrier patterns 11B may be respectively located between the blocking layer 13 and the conductive patterns 11A. Each of the barrier patterns 11B may have a C-shaped section. The barrier patterns 11B may include metal nitride. The conductive pattern 11A may include a conductive material, such as poly-silicon, tungsten, molybdenum, or other metal. The insulating layer 12 may be used to insulate the stacked conductive layers 11 from each other. The insulating layers 12 may include an insulating material, such as oxide, nitride or an air gap.

The channel layer 16 may penetrate the gate structure GST. The channel layer 16 may extend in a stacking direction of the conductive layers 11 and the insulating layers 12. The channel layer 16 may be a region in which a channel of a memory cell, a select transistor, or the like is formed. The channel layer 16 may include a semiconductor material. In an embodiment, the channel layer 16 may include silicon, germanium, a nano structure, etc.

The tunnel insulating layer 15 may be formed to surround a sideman of the channel layer 16. In an embodiment, the tunnel insulating layer 15 may include pure oxide. The core 17 may be formed in the channel layer 16. The core 17 may have a single- or multi-layered structure. The core 17 may include an insulating material, such as oxide, nitride or an air gap. Alternatively, the core 17 may include a conductive material and may be an electrode layer, a vertical bit line, or the like.

The semiconductor device may have a form in which the core 17 is omitted, or the channel layer 16 is filled even in the center thereof.

The memory patterns 14 may be respectively located between the conductive layers 11 and the channel layer 16, The memory patterns 14 may include a floating gate, a charge trap material, poly-silicon, nitride, a variable resistance material, a phase change material, and the like, or may include a combination thereof. The memory patterns 14 may be located between the insulating layers 12. Each of the memory patterns 14 may be in contact with an upper insulating layer 12 and a lower insulating layer 12, Each of the memory patterns 14 may have a first height H1, and each of the conductive layers 11 may have a second height H2, The first height H1 may be substantially equal to or different from the second height H2. In an embodiment, the first height H1 may be higher than the second height H2.

The blocking layer 13 may include first blocking patterns 13A, a second blocking pattern 13B, or third blocking patterns 13C, or include any combination thereof.

The first blocking patterns 13A may be respectively located between the conductive layers 11 and the memory pattern 14, The first blocking patterns 13A may include oxide. Each of the first blocking patterns 13A may have substantially the same height H1 as each of the memory patterns 14, Each of the first blocking patterns 13A may have a first thickness T1, and the first thickness T1 may be 1 to 10 nm.

The second blocking pattern 13B may be located between the first blocking patterns 13A and the conductive layers 11 and between the conductive layers 11 and the insulating layers 12. The second blocking pattern 13B may extend to sidewalls of the insulating layers 12. The second blocking pattern 13B may surround the conductive layers 11, and the barrier patterns 11B may be respectively located between the second blocking pattern 13B and the conductive patterns 11A. The second blocking pattern 13B may have a second thickness T2, and the second thickness T2 may be 1 to 10 nm.

The second blocking pattern 13B may include a material with a dielectric constant that is higher than that of the first blocking patterns 13A. The second blocking pattern 13B may include a high dielectric constant (high-k) material. In an embodiment, the second blocking pattern 13B may include silicon nitride ($Si_3N_4$), aluminum oxide ($Al_2O_3$), titanium oxide ($TiO_2$), tantalum oxide ($Ta_2O_5$), yttrium oxide ($Y_2O_3$), hafnium oxide ($HfO_2$), zirconium oxide ($ZrO_2$), zirconium silicate ($ZrSiO_4$), or hafnium silicate ($HfSiO_4$), or include any combination thereof. In an embodiment, the second blocking pattern 13B may include hafnium silicate ($HfSiO_x$), and may adjust a dielectric constant of the second blocking pattern 13B by adjusting a silicon concentration of the hafnium silicate ($HfSiO_x$). The second blocking pattern 13B with a relatively high silicon content may have a dielectric constant that is lower than that of the second blocking pattern 13B with a relatively low silicon content, Thus, the dielectric constant of the second blocking pattern 13B may be adjusted with the silicon content so that a gate coupling ratio can be tuned.

The third blocking patterns 13C may be respectively located between the first blocking patterns 13A and the memory patterns 14. Each of the third blocking patterns 13C may have substantially the same height H1 as each of the memory patterns 14. Each of the third blocking patterns 13C may have substantially the same height H1 as each of the first blocking patterns 13A, Each of the third blocking patterns 13C may have a third thickness T3, and the third thickness T3 may be 1 to 10 nm.

The third blocking patterns 13C may include a material with a dielectric constant that is higher than that of the first blocking patterns 13A. The third blocking patterns 13C may include a high dielectric constant (high-k) material. In an embodiment, the third blocking patterns 13C may include silicon nitride ($Si_3N_4$), aluminum oxide ($Al_2O_3$), titanium oxide ($TiO_2$), tantalum oxide ($Ta_2O_5$), yttrium oxide ($Y_2O_3$), hafnium oxide ($HfO_2$), zirconium oxide ($ZrO_2$), zirconium silicate ($ZrSiO_4$), or hafnium silicate ($HfSiO_4$), or include any combination thereof. In an embodiment, the third blocking patterns 13C may include hafnium silicate (HfSiO$_x$), and may adjust a dielectric constant of the third blocking patterns 13C by adjusting a silicon concentration of the hafnium silicate (HfSiO$_x$). Accordingly, the gate coupling ratio can be tuned.

The third blocking patterns 13C may substantially include the same material as the second blocking pattern 13B, or include a material different from that of the second blocking pattern 13B. In an embodiment, the second blocking pattern 13B and the third blocking patterns 13C may include hafnium silicate (HfSiO$_x$), and a concentration of silicon included in the second blocking pattern 13B and a concentration of silicon included in the third blocking patterns 13C may be substantially equal to or different from each other.

Referring to FIG. 1B, the semiconductor device may further include metal patterns 18. The metal patterns 18 may be respectively located between the blocking layer 13 and the memory patterns 14. In an embodiment, the metal patterns 18 may be respectively located between the first blocking patterns 13A and the memory patterns 14 or may be respectively located between the third blocking patterns 13C and the memory patterns 14. The metal patterns 18 may have substantially the same height H1 as the first blocking patterns 13A, the third blocking patterns 13C, or the memory patterns 14. In an embodiment, each of the metal patterns 18 may have a fourth thickness T4, and the fourth thickness T4 may be 1 to 100 Å.

The metal patterns 18 may include a metal with a relatively high work function. The metal with the high work function may have a high Fermi energy and may increase an inelastic scattering rate of electrons. Therefore, electrons that are tunneling toward the blocking layer 13 from the memory patterns 14 may be trapped in the metal pattern 18. Although the blocking layer 13 includes a high dielectric constant (high-k) material, an increase in leakage current can be prevented or minimized. In an embodiment, the metal patterns 18 may include pure metal, metal nitride, or metal silicide. The metal patterns 18 may include titanium (Ti), platinum (Pt), tin (Sn), ruthenium (Ru), or titanium nitride (TiN), or include any combination thereof. The metal patterns 18 may include a nano structure such as a nano dot, a nano cluster, or a nano thin film.

According to the structure described above, since the blocking layer 13 includes a high dielectric constant (high-k) material, the gate coupling ratio can be increased. Further, the concentration of silicon included in the hafnium silicate (HfSiO$_x$) may be adjusted, thereby tuning the gate coupling ratio. Since the blocking layer 13 is not interposed between the memory patterns 14 and the insulating layers 12, the height of the gate structure GST can be decreased, and the degree of integration of the semiconductor device can be improved. Since the metal patterns 18 are located between the blocking layer 13 and the memory patterns 14, the leakage current can be reduced.

Figure 2A:
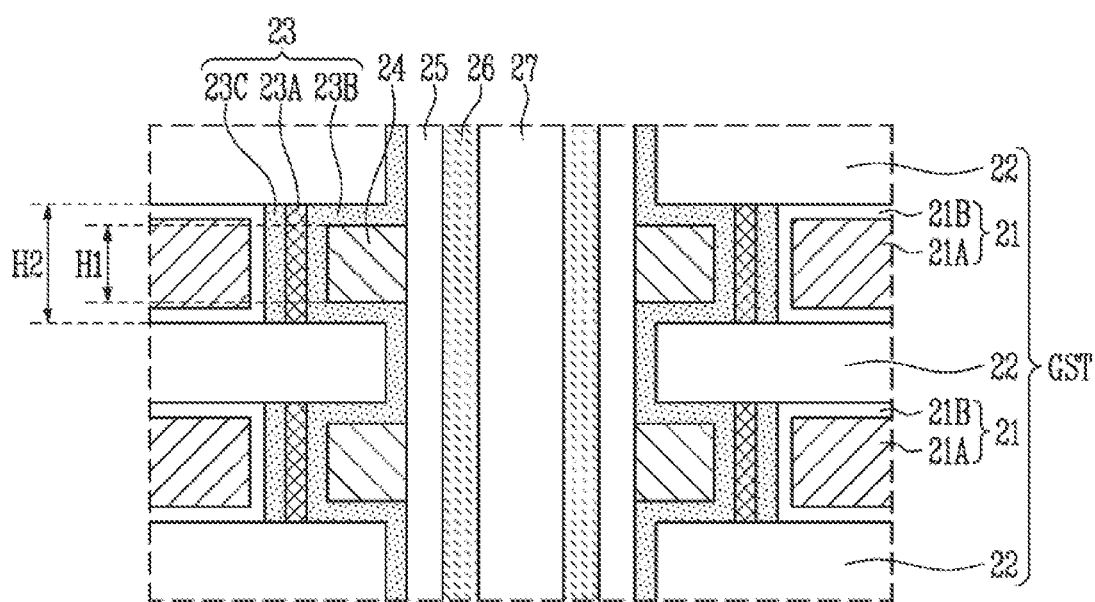
FIGS. 2A to 2C are views illustrating a structure of a semiconductor device in accordance with an embodiment of the present disclosure.
Figure 2B:
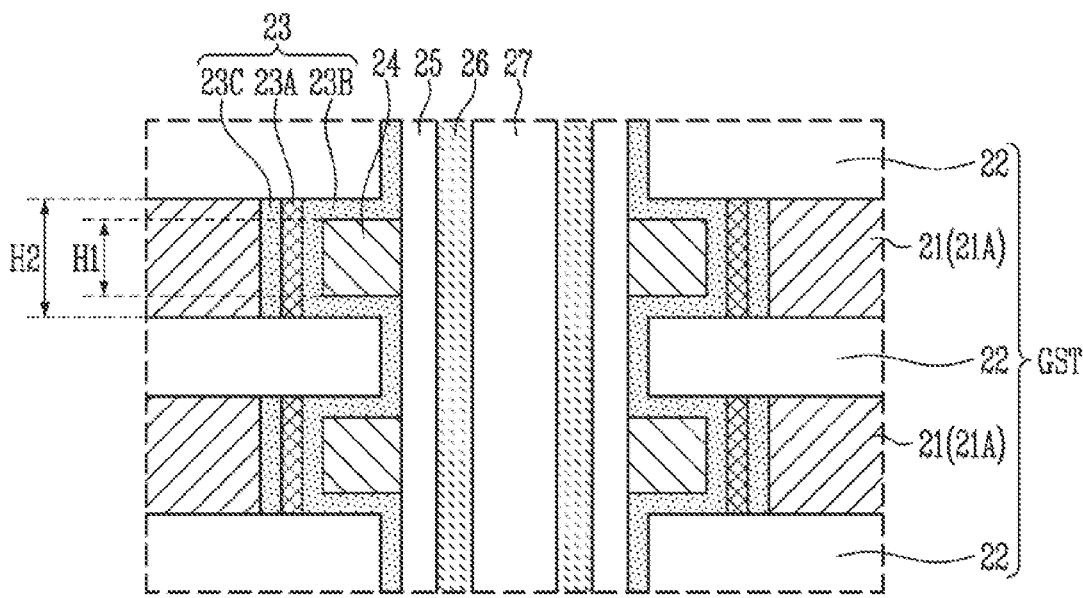
Figure 2C:
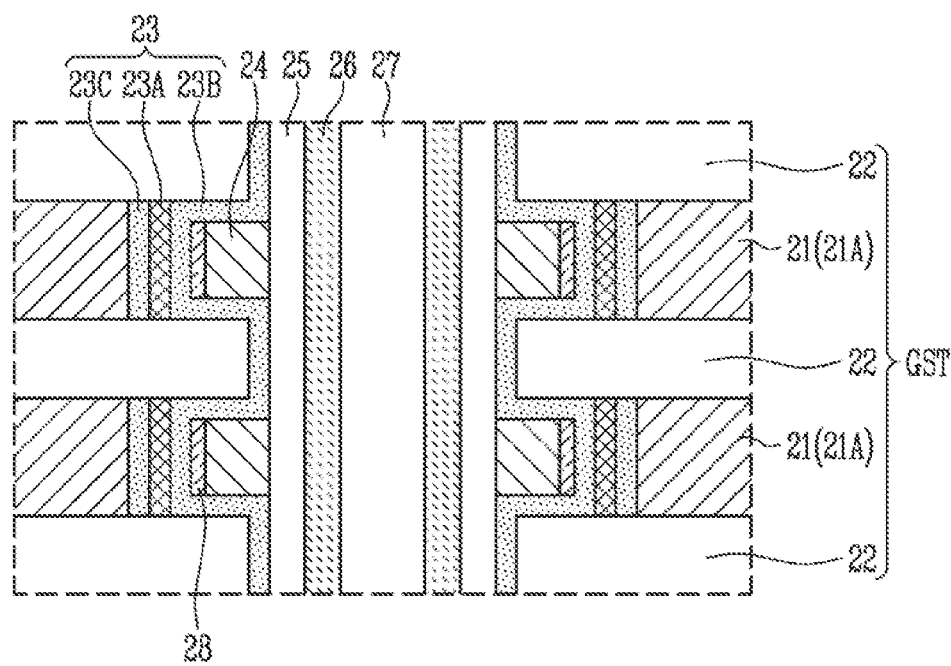

FIGS. 2A to 2C are views illustrating a structure of a semiconductor device in accordance with an embodiment of the present disclosure. Hereinafter, descriptions of portions overlapping with those described above will be omitted.

Referring to FIG. 2A, the semiconductor device may include a gate structure GST, a channel layer 26, memory patterns 24, and a blocking layer 23. The semiconductor device may further include a tunnel insulating layer 25, a core 27, or a combination thereof.

The gate stack structure GST may include conductive layers 21 and insulating layers 22, which are alternately stacked. The conductive layers 21 may be control gates. Each of the conductive layers 21 may include a conductive pattern 21A and a barrier pattern 21B. The barrier patterns 21B may be located between the conductive patterns 21A and third blocking patterns 23C and between the conductive patterns 21A and the insulating layers 22. The channel layer 26 may penetrate the gate structure GST. The tunnel insulating layer 25 may be formed to surround a sidewall of the channel layer 26. The core 27 may be formed in the channel layer 26.

The memory patterns 24 may be respectively located between the conductive layers 21 and the channel layer 26. In an embodiment, the memory patterns 24 may include a floating gate, a charge trap material, poly-silicon, nitride, a variable resistance material, a phase change material, and the like, or may include a combination thereof. The memory patterns 24 may be located between the insulating layers 22. Each of the memory patterns 24 may be surrounded by the blocking layer 23. Each of the memory patterns 24 may have a first height H1, and each of the conductive layers 21 may have a second height H2. The first height H1 may be substantially equal to or different from the second height H2, In an embodiment, the second height H2 may be higher than the first height H1.

The blocking layer 23 may include first blocking patterns 23A, a second blocking pattern 23B, the third blocking patterns 23C, or a combination thereof. The first blocking patterns 23A may be respectively located between the conductive layers 21 and the memory patterns 24. Each of the first blocking patterns 23A may have substantially the same height H2 as each of the conductive layers 21. The first blocking patterns 23A may include hafnium silicate (HfSiO$_x$). When the first blocking patterns 23A includes the hafnium silicate (HfSiO$_x$), a dielectric constant of the first blocking patterns 23A may be adjusted by adjusting a silicon concentration of the hafnium silicate (HfSiO$_x$). Accordingly, a gate coupling ratio can be tuned.

The second blocking pattern 23B may be located between the first blocking patterns 23A and the memory patterns 24 and between the memory patterns 24 and the insulating layers 22, The second blocking pattern 23B may extend to sidewalls of the insulating layers 22. The second blocking pattern 23B may surround the memory patterns 24, The second blocking pattern 23B may include a material with a dielectric constant that is lower than that of the first blocking patterns 23A. In an embodiment, the second blocking pattern 23B may include oxide.

The third blocking patterns 23C may be respectively located between the first blocking patterns 23A and the conductive layers 21. Each of the third blocking patterns 23C may have substantially the same height H2 as each of the conductive layers 21. Each of the third blocking patterns 23C may have substantially the same height H2 as each of the first blocking patterns 23A. The third blocking patterns 23C may include a material with a dielectric constant that is lower than that of the first blocking patterns 23A. In an embodiment, the third blocking patterns 23C may include oxide.

Referring to FIG. 2B, each of the conductive layers 21 may include a conductive pattern 21A and might not include the barrier pattern. Each of the conductive patterns 21A may have a second height H2, and each of the memory patterns 24 may have a first height H1. The first height H1 and the second height H2 may be substantially equal to or different from each other. The second height H2 may be higher than the first height H1.

Referring to FIG. 2C, the semiconductor device may further include metal patterns 28, The metal patterns 28 may be respectively located between the blocking layer 23 and the memory patterns 24. In an embodiment, the metal patterns 28 may be respectively located between the first blocking patterns 23A and the memory patterns 24, or be respectively located between the third blocking patterns 23C and the memory patterns 24. The metal patterns 28 may have a height that is lower than that of the first blocking patterns 23A or the third blocking patterns 23C. The metal patterns 28 may have substantially the same height as the memory patterns 24, Since the metal patterns 28 are located between the blocking layer 23 and the memory patterns 24, leakage current can be decreased.

According to the structure described above, since the blocking layer 23 includes a high dielectric constant (high-k) material, the gate coupling ratio can be increased. Further, the concentration of silicon included in the hafnium silicate (HfSiOx) is adjusted, thereby tuning the gate coupling ratio. The blocking layer 23 might not be interposed between the conductive layers 21 and the insulating layers 22. Thus, the height of the gate stack structure GST can be decreased, and the degree of integration of the semiconductor device can be improved. Since the metal patterns 28 are located between the blocking layer 23 and the memory patterns 24, the leakage current can be reduced.

FIGS. 3A to 3K are views illustrating a manufacturing method of a semiconductor device in accordance with an embodiment of the present disclosure. Hereinafter, descriptions of portions overlapping with those described above will be omitted.

Figure 3A:
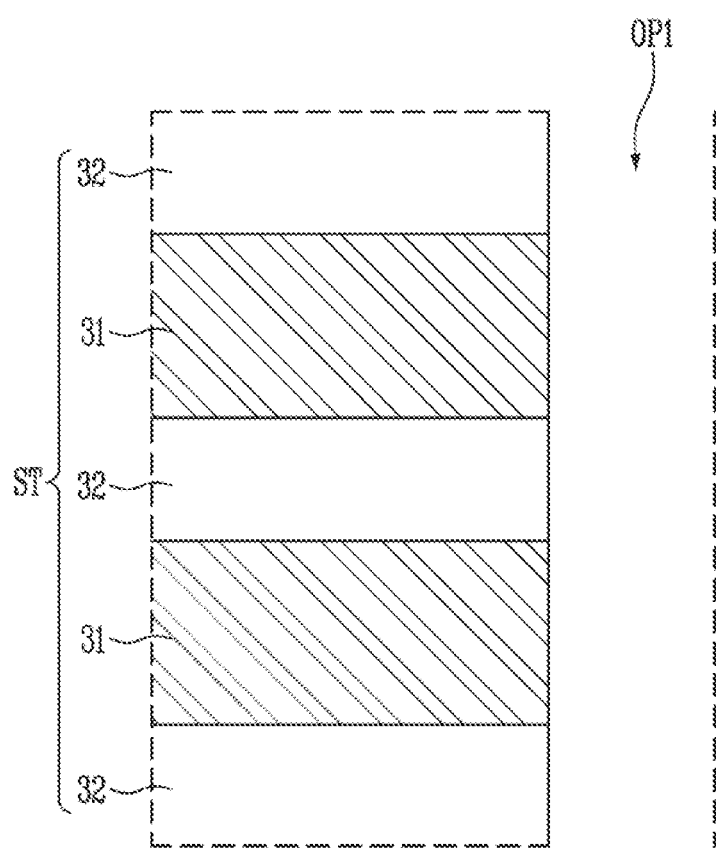

Referring to FIG. 3A, a stack structure ST is formed. The stack structure ST may include first material layers 31 and second material layers 32, which are alternately stacked. The first material layers 31 may include a material with a high etch selectivity with respect to the second material layers 32. In an embodiment, the first material layers 31 may include a sacrificial material, such as nitride, and the second material layers 32 may include an insulating material, such as oxide.

Subsequently, a first opening OP1 may be formed, which penetrates the stack structure ST. The first opening OP1 may have a plane with a circular shape, an elliptical shape, a polygonal shape, or the like. In an embodiment, a plurality of first openings OP1 may be formed, which are arranged in a first direction and a second direction that intersects the first direction.

Figure 3B:
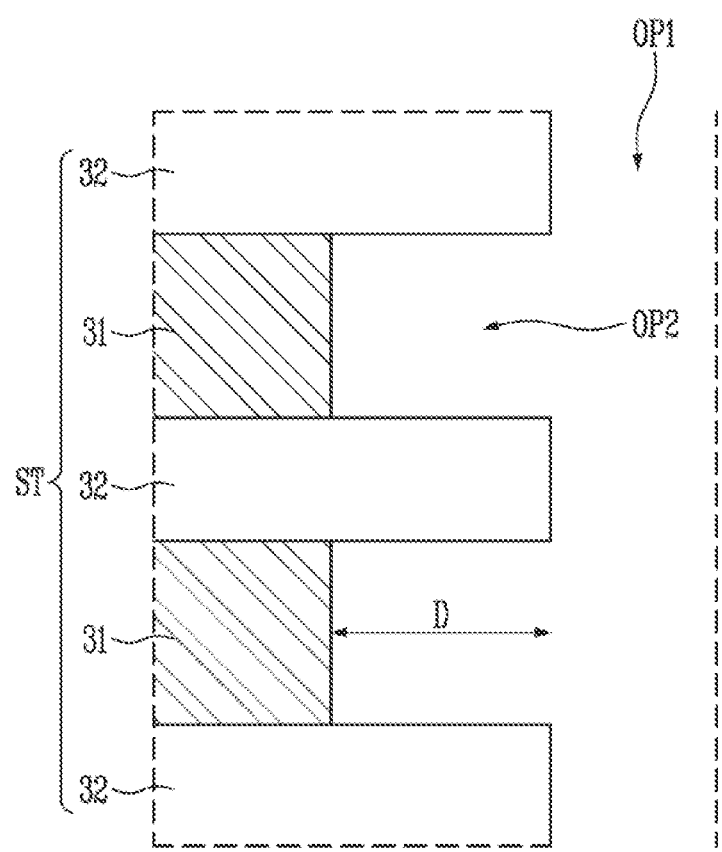

Referring to FIG. 3B, second openings OP2 are formed between the second material layers 32. The second openings OP2 may be used to secure spaces for forming memory cells. The second openings OP2 may be formed by selectively etching the first material layers 31. The second openings OP2 may be connected to the first opening OP1.

Figure 3C:
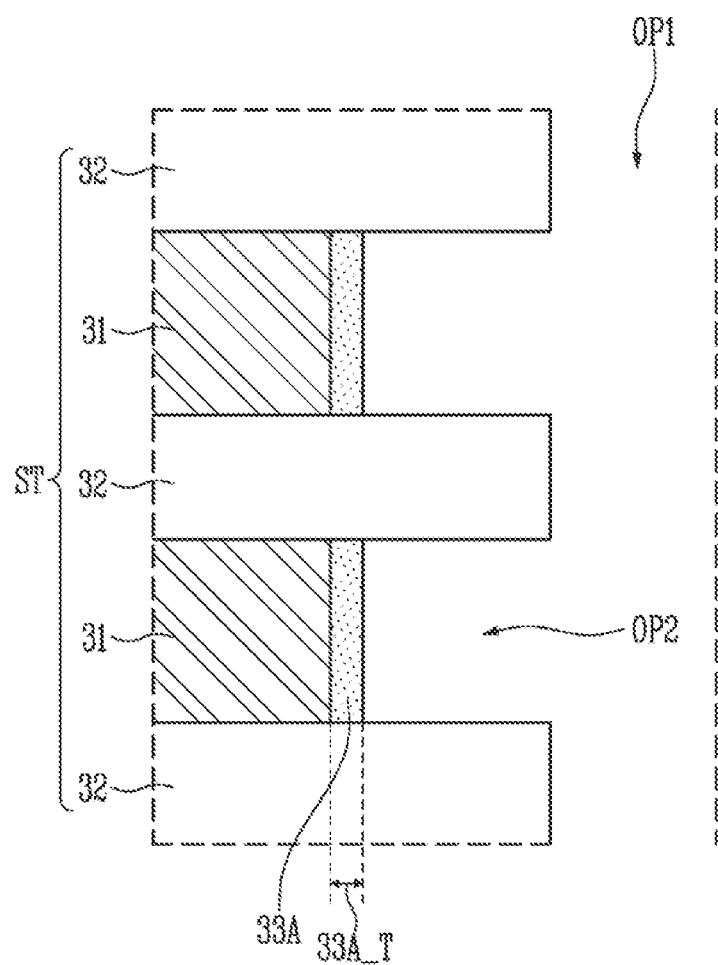

Referring to FIG. 3C, first blocking patterns 33A are formed on the first material layers 31 exposed through the second openings OP2. The first blocking patterns 33A may be formed by oxidizing the first material layers 31 exposed through the second openings OP2, The first blocking patterns 33A may be respectively located in the second openings OP2, and be isolated from each other. The first blocking patterns 33A may include oxide. A thickness 33A_T of each of the first blocking patterns 33A may be 1 to 10 nm.

Figure 3D:
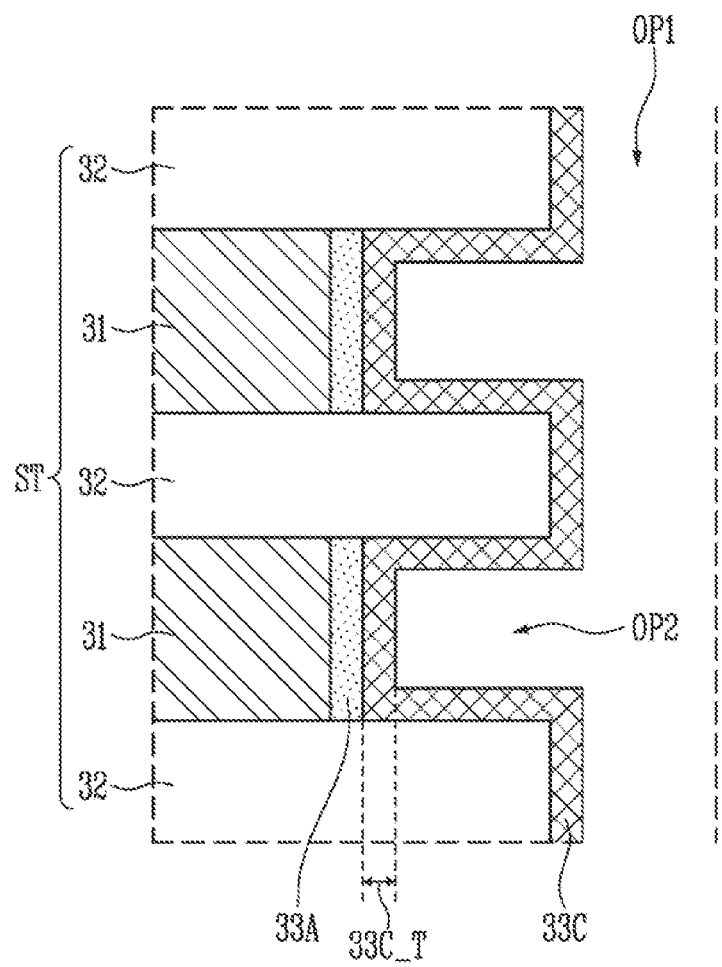

Referring to FIG. 3D, a third blocking layer 33C is formed. The third blocking layer 33C may be formed in the first opening OP1 and the second opening OP2. The third blocking layer 33C may be formed along surfaces of the second material layers 32, which are exposed through the first opening OP1 and the second openings OP2, and surfaces of the first blocking patterns 33A. The third blocking layer 33 may include a material with a dielectric constant that is higher than that of the first blocking patterns 33A. In an embodiment, the third blocking layer 33C may include hafnium silicate (HfSiO$_x$). A thickness 33C_T of the third blocking layer 33C may be 1 to 10 nm.

Referring to FIG. 3E, sacrificial layers 62 are respectively formed in the second openings OP2. In an embodiment, the sacrificial layers 62 may be formed by forming a sacrificial material layer in the first opening OP1 and the second openings OP2, and then etching a portion of the sacrificial material layer, which is formed in the first opening OP1. The third blocking layer 33C may be partially exposed by the sacrificial layers 62. Portions of the third blocking layer 33C, which are formed in the second openings OP2, may be covered by the sacrificial layers 62, and a portion of the third blocking layer 33C, which is formed in the first opening OP1, may be exposed. The sacrificial layers 62 may include a material with a high etch selectivity with respect to the second material layers 32 and the third blocking layer 33C. In an embodiment, the sacrificial layers 62 may include poly-silicon, tungsten, etc.

Figure 3F:
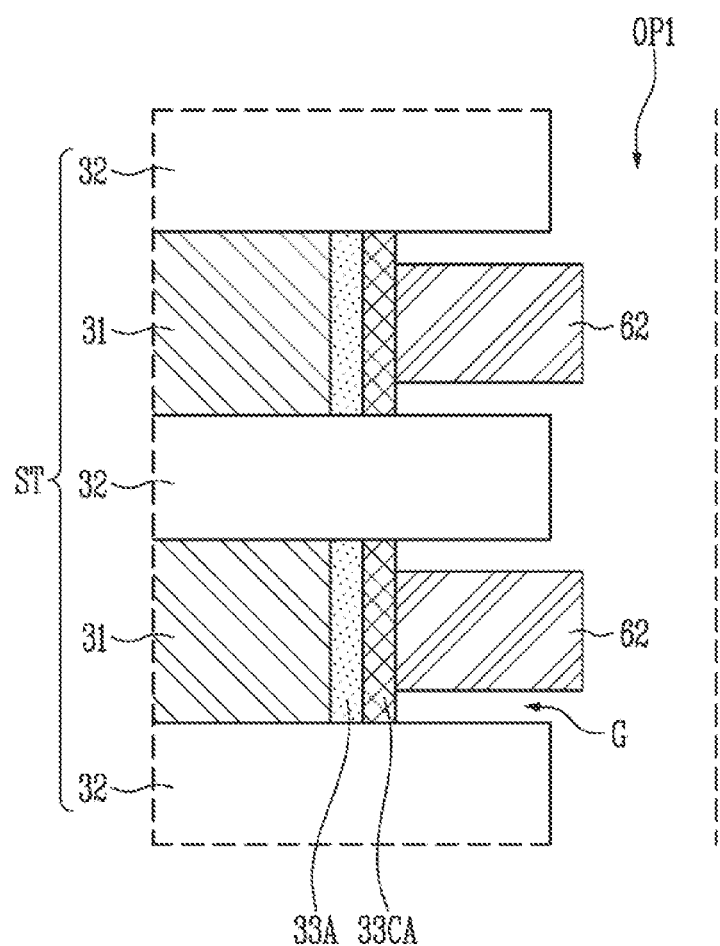

Referring to FIG. 3F, third blocking patterns 33CA are formed. The third blocking patterns 33CA may be formed by selectively etching the third blocking layer 33C, Portions of the third blocking layer 33C, which are exposed by the sacrificial layers 62, may be etched, and portions located between the first blocking patterns 33A and the sacrificial layers 62 may remain. Accordingly, grooves G may be formed between the sacrificial layers 62 and the second material layers 32.

Figure 3G:
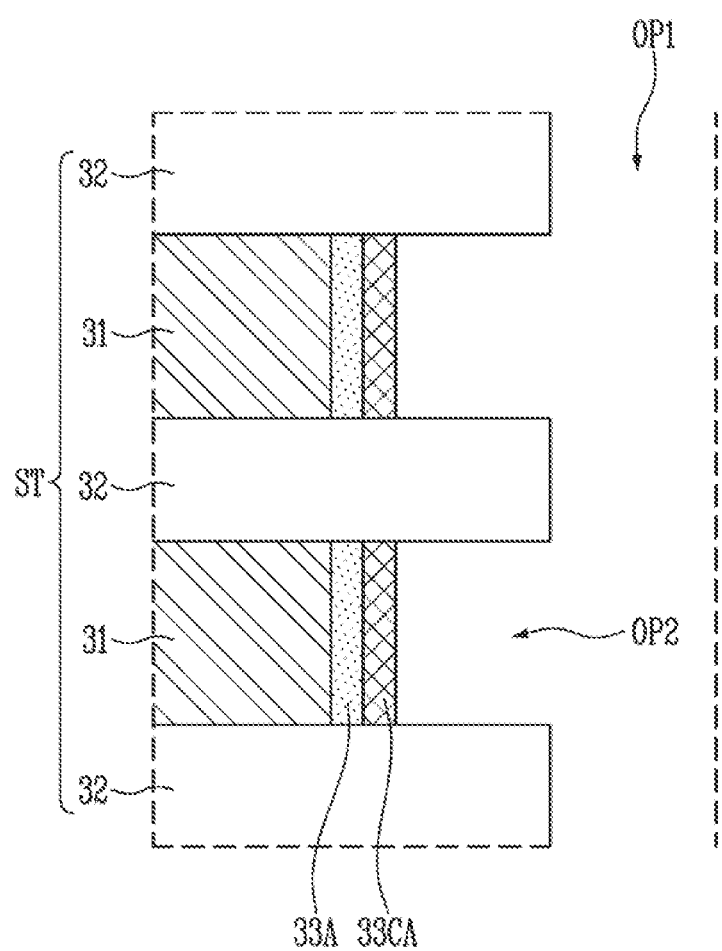

Referring to FIG. 3G, the sacrificial layers 62 are removed. The second openings OP2 may be again opened by selectively etching the sacrificial layers 62. The second material layers 32 and the third blocking patterns 33CA may be exposed by the second openings OP2.

Figure 3H:
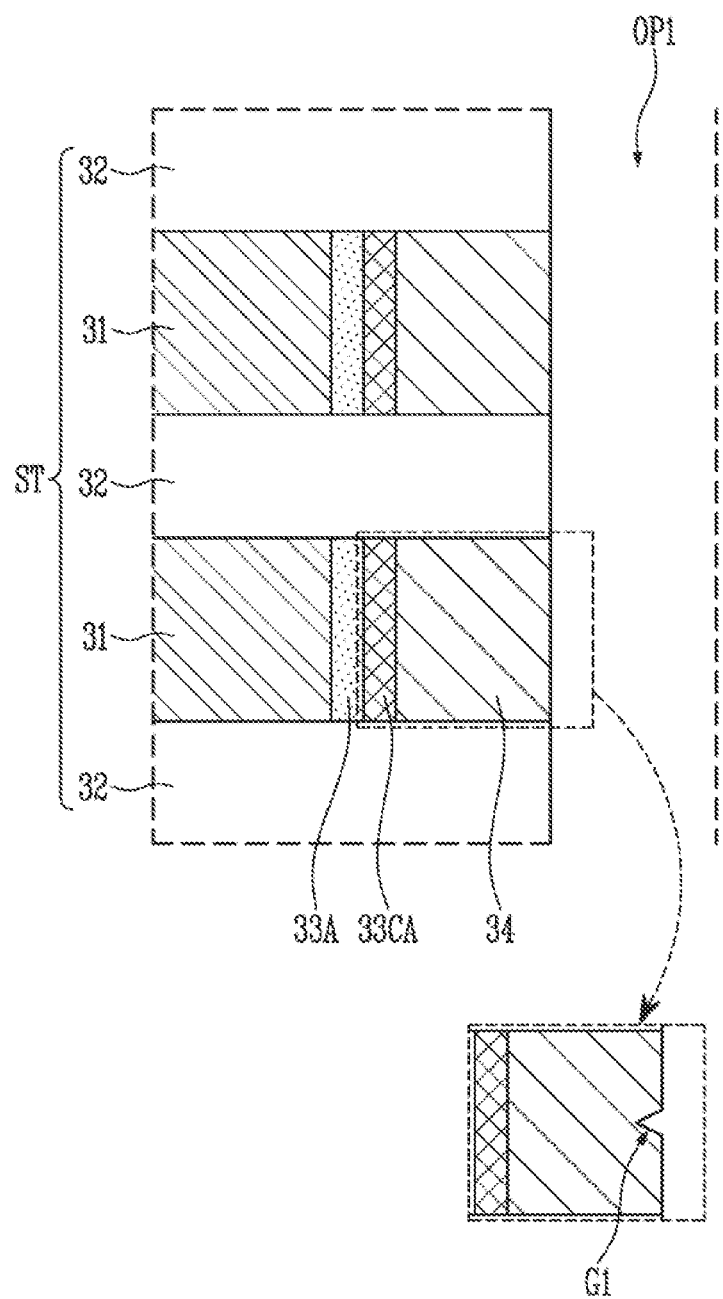

Referring to FIG. 3H, memory patterns 34 are respectively formed in the second openings OP2. The memory patterns 34 may be isolated from each other by the second material layers 32. In an embodiment, the memory patterns 34 may be formed by forming a memory layer in the first opening OP1 and the second openings OP2, and then etching a portion of the memory layer, which is formed in the first opening OP1. Each of the memory patterns 34 may have a surface exposed through the first opening OP1, and include a groove G1 at the surface thereof. The groove G1 may be caused in a process of depositing the memory layer along inner surfaces of the first opening OP1 and the second openings OP2.

The memory patterns 34 may include a floating gate, a charge trap material, poly-silicon, nitride, a variable resistance material, a phase change material, and the like, or may include a combination thereof. In an embodiment, the memory patterns 34 may be floating gates. The memory patterns 34 may be formed by forming a floating gate layer in the first opening OP1 and the second openings OP2, and then etching the floating gate layer. The shape of the floating gates may be controlled by performing wet etching and oxidation on the floating gate layer.

Figure 3I:
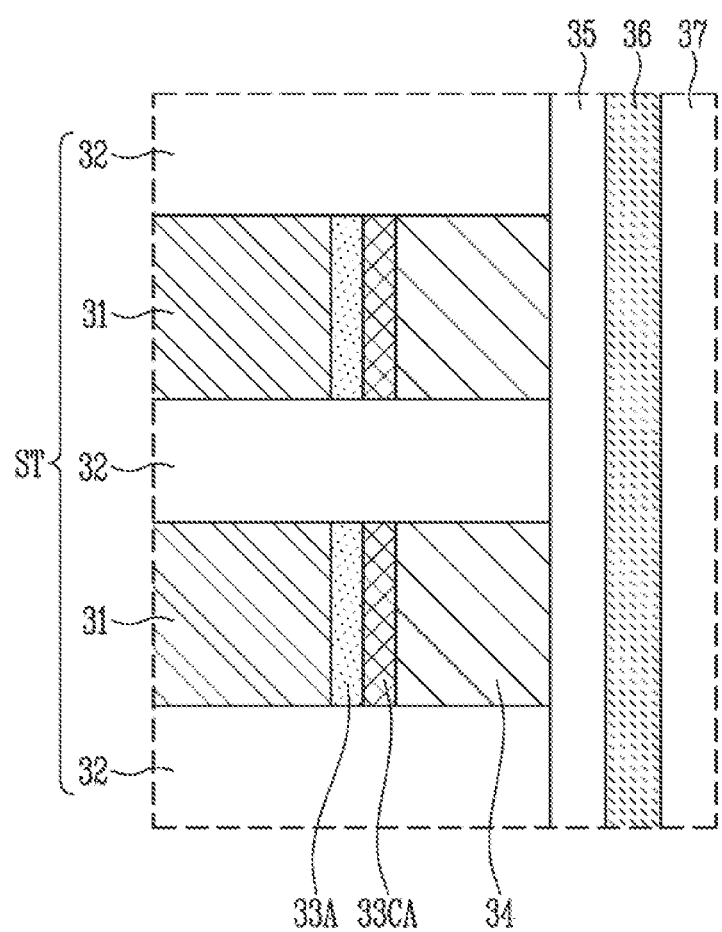

Referring to FIG. 3I, a tunnel insulating layer 35 is formed in the first opening OP1, When each of the memory patterns 34 includes the groove G1 at the surface thereof, the tunnel insulating layer 35 may be filled in the groove G1, Subsequently, a channel layer 36 is formed in the tunnel insulating layer 35. The channel layer 36 may completely fill the first opening OP1 or partially fill the first opening OP1, Subsequently, a core 37 may be formed in the channel layer 36.

Figure 3J:
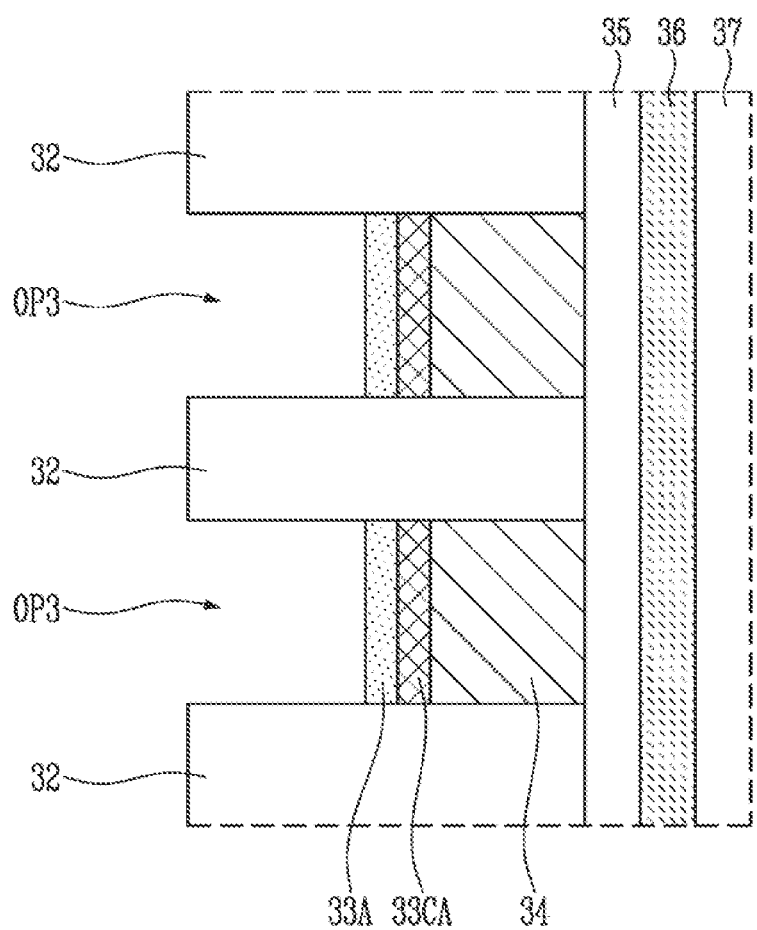

Referring to FIG. 3J, third openings OP3 may be formed by removing the first materials 31, In an embodiment, the third openings OP3 may be formed by forming a slit (not shown) penetrating the stack structure ST and then selectively etching the first material layers 31. The first blocking patterns 33A may be respectively exposed through the third openings OP3.

Figure 3K:
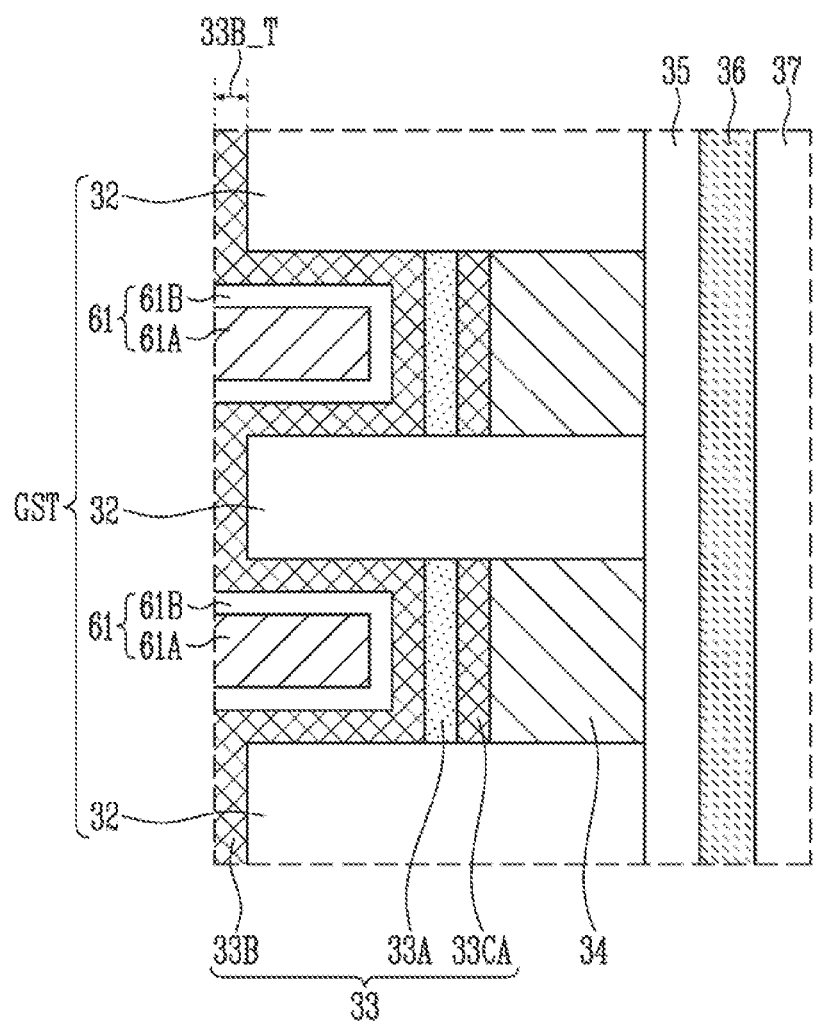

Referring to FIG. 3K, a second blocking pattern 33B is formed. In an embodiment, the second blocking pattern 33B may be formed along inner surfaces of the first opening OP1 and the third openings OP3. The second blocking pattern 33B may be formed on the surfaces of the second material layers 32 and the surfaces of the first blocking patterns 33A. The second blocking pattern 33B may include a material with a dielectric constant that is higher than that of the first blocking patterns 33A. In an embodiment, the second blocking pattern 33B may include hafnium silicate (HfSiO$_x$). Accordingly, a blocking layer may be formed, which includes the first blocking patterns 33A, the second blocking pattern 33B, and the third blocking patterns 33CA.

Subsequently, third material layers 61 may be respectively formed in the third openings OP3. In an embodiment, the third material layers 61 may be formed by forming a third material layer in the first opening OP1 and the third openings OP3, and then etching a portion of the third material layer, which is formed in the first opening OP1. The third material layers 61 may be isolated from each other. In an embodiment, the third material layers 61 may be control gates. The third material layers 61 may be surrounded by the second blocking pattern 33B. Each of the third material layers 61 may have a height that is lower than that of each of the memory patterns 34. Accordingly, a gate structure GST may be formed, in which the third material layers 61 and the second material layers 32 are alternately stacked.

Each of the third material layers 61 may include a conductive pattern 61A and a barrier pattern 61B. In an embodiment, after a barrier layer and a conductive layer are formed in the first opening OP1 and the third openings OP3, a portion of the barrier layer, which is formed in the first opening OP1, and a portion of the conductive layer, which is formed in the first opening OP1, may be etched. Accordingly, the conductive patterns 61A and the barrier patterns 61B respectively surrounding the conductive patterns 61A may be formed.

According to the manufacturing method described above, the blocking layer 33 including a high dielectric constant (high-k) material is formed. Thus, a gate coupling ratio can be increased. Also, the blocking layer 33 is formed not to be interposed between the memory patterns 34 and the second material layers 32. Thus, the length of the floating gate can be increased, and a program/erase window can be increased. Further, the height of the gate structure GST can be decreased, and the degree of integration of the semiconductor device can be improved.

FIGS. 4A to 4F are views illustrating a manufacturing method of a semiconductor device in accordance with an embodiment of the present disclosure. Hereinafter, descriptions of portions overlapping with those described above will be omitted.

Figure 4A:
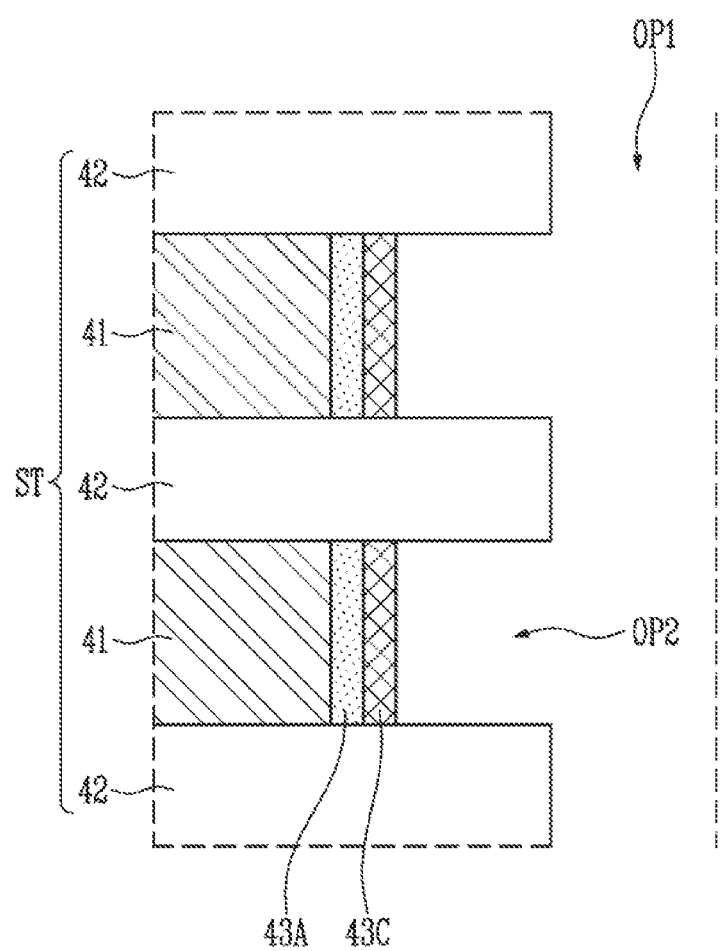
FIGS. 4A to 4F are views illustrating a manufacturing method of a semiconductor device in accordance with an embodiment of the present disclosure.

Referring to FIG. 4A, a stack structure ST is formed. The stack structure ST may include first material layers 41 and second material layers 42, which are alternately stacked. The first material layers 41 may include a material with a high etch selectivity with respect to the second material layers 42. Subsequently, a first opening OP1 may be formed, which penetrates the stack structure ST. Subsequently, second openings OP2 may be formed by etching the first material layers 41. Subsequently, first blocking patterns 43 may be formed by oxidizing the first material layers 41 exposed through the second openings OP2. Subsequently, third blocking patterns 43C may be respectively formed in the second openings OP2. In an embodiment, the third blocking patterns 43C may be formed by forming a third blocking layer in the first opening OP1 and the second openings OP2, and then etching the third blocking layer, using a sacrificial layer. The third blocking patterns 43C may include a material with a dielectric constant that is higher than that of the first blocking patterns 43A, In an embodiment, the third blocking patterns 43C may include hafnium silicate (HfSiO$_x$).

Referring to FIGS. 4B to 4E, metal patterns 48A are respectively formed in the second openings OP2, In an embodiment, the metal patterns 48A may be formed by selectively depositing a metal on surfaces of the third blocking patterns 43C, which are exposed through the second openings OP2. In an embodiment, the metal patterns 48A may be formed through an etching process using sacrificial layers 72. Hereinafter, a process using the sacrificial layers 72 will be described.

Figure 4B:
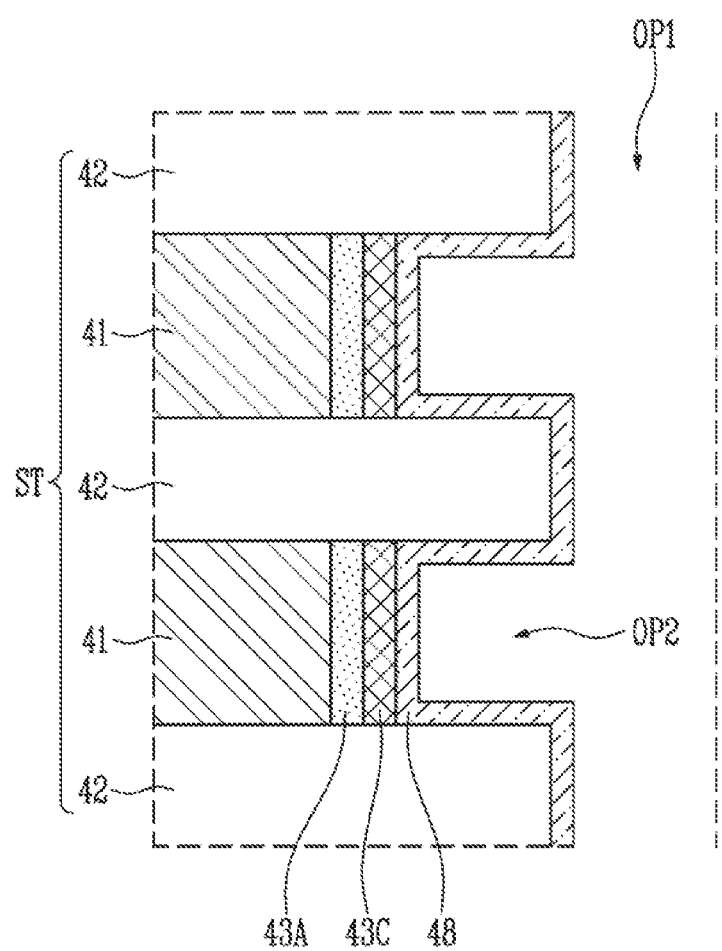

First, referring to FIG. 4B, a metal layer 48 is formed. The metal layer 48 may be formed in the first opening OP1 and the second openings OP2. The metal layer 48 may be formed along surfaces of the second material layers 42 and the surfaces of the third blocking patterns 43C, which are exposed through the first opening OP1 and the second openings OP2, The metal layer 48 may include pure metal or include metal nitride. The metal layer 48 may include titanium nitride (TiN), titanium (Ti), platinum (Pt) or ruthenium (Ru), or include any combination thereof. The metal layer 48 may include a nano structure such as a nano dot, a nano duster, or a nano thin film.

Figure 4C:
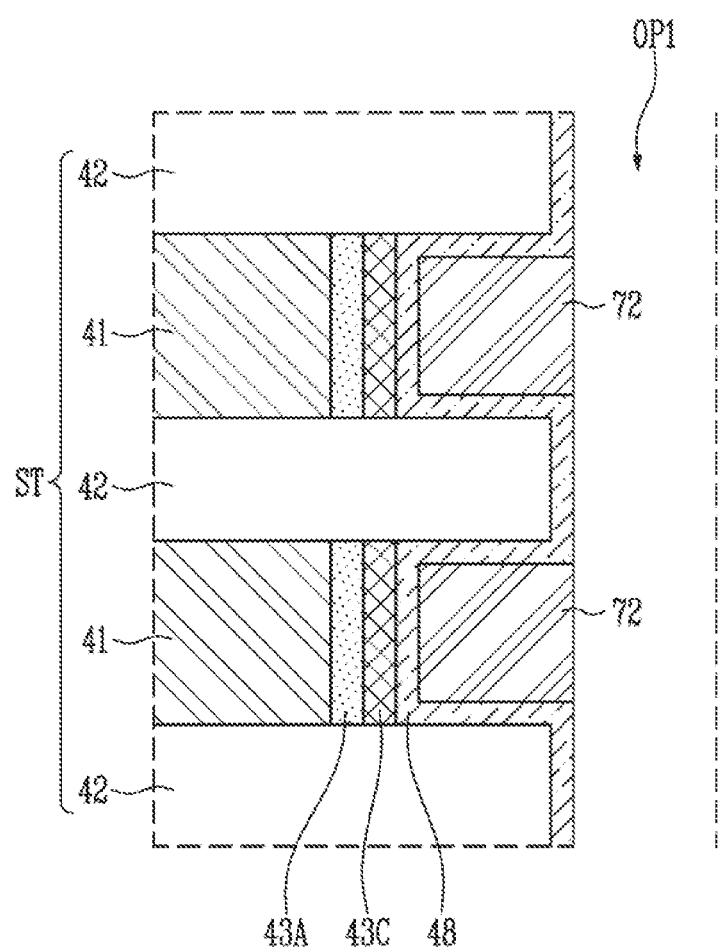

Referring to FIG. 4C, the sacrificial layers 72 are respectively formed in the second openings OP2. The sacrificial layers 72 may include a material with a high etch selectivity with respect to the second material layers 42 and the metal layer 48. In an embodiment, the sacrificial layers 72 may include poly-silicon, silicon oxide (SiO$_2$), silicon nitride (Si$_x$N$_y$), etc.

Figure 4D:
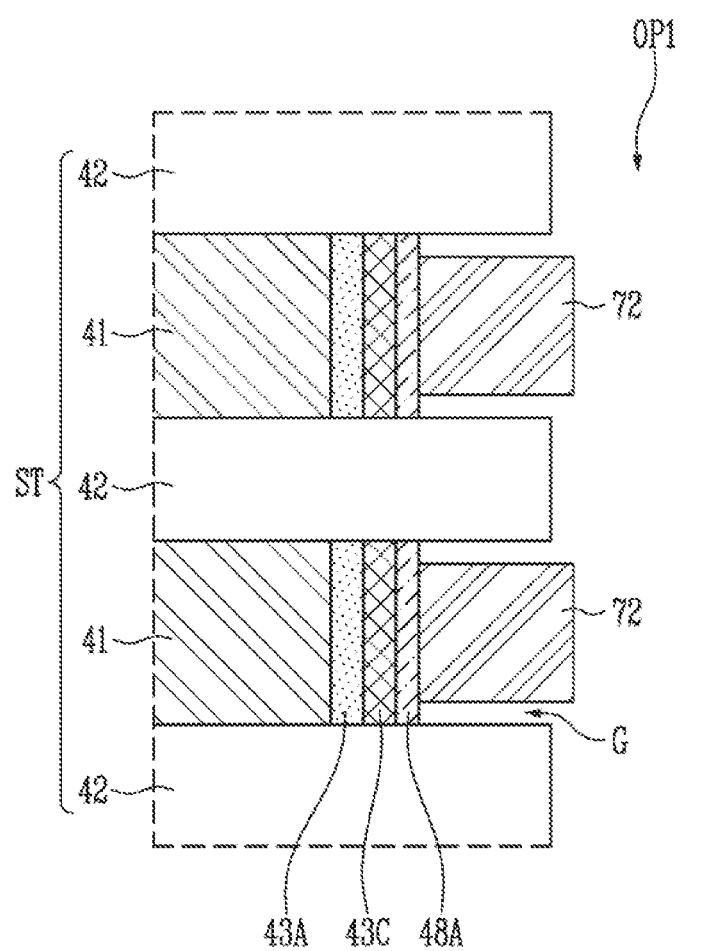

Referring to FIG. 4D, the metal patterns 48A are formed. The metal patterns 48A may be formed by selectively etching the metal layer 48. Portions of the metal layer 48, which are exposed by the sacrificial layers 72, may be etched, and portions that are located between the third blocking patterns 43C and the sacrificial layers 72 may remain. Accordingly, grooves G may be formed between the sacrificial layers 72 and the second material layers 42.

Figure 4E:
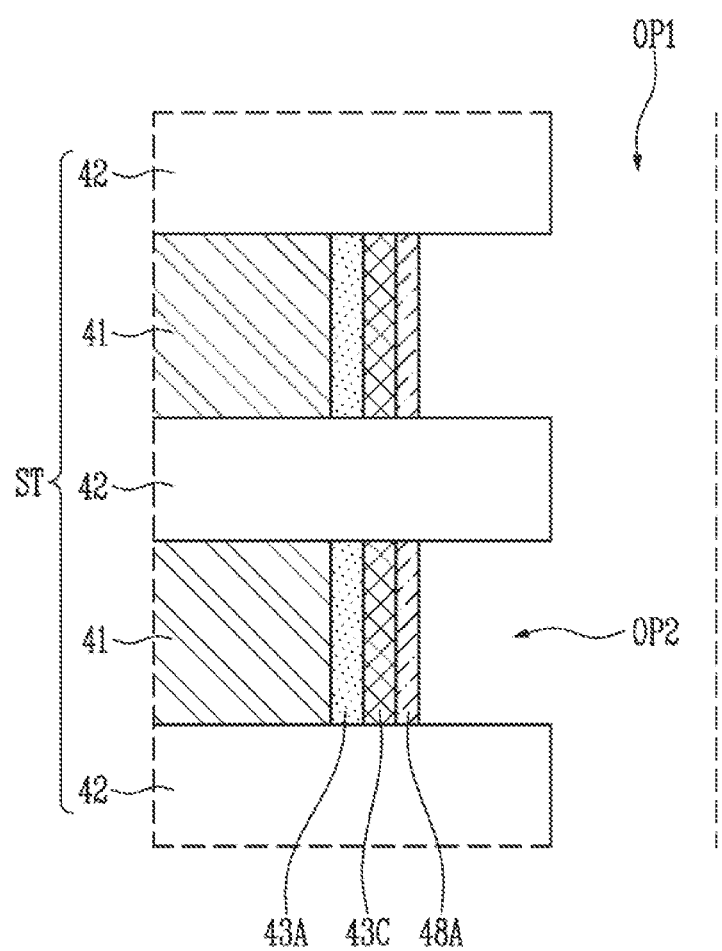

Referring to FIG. 4E, the sacrificial layers 72 are removed. The second openings OP2 may be again opened by selectively etching the sacrificial layers 72. The second material layers 42 and the metal patterns 48A may be exposed by the second openings OP2.

Figure 4F:
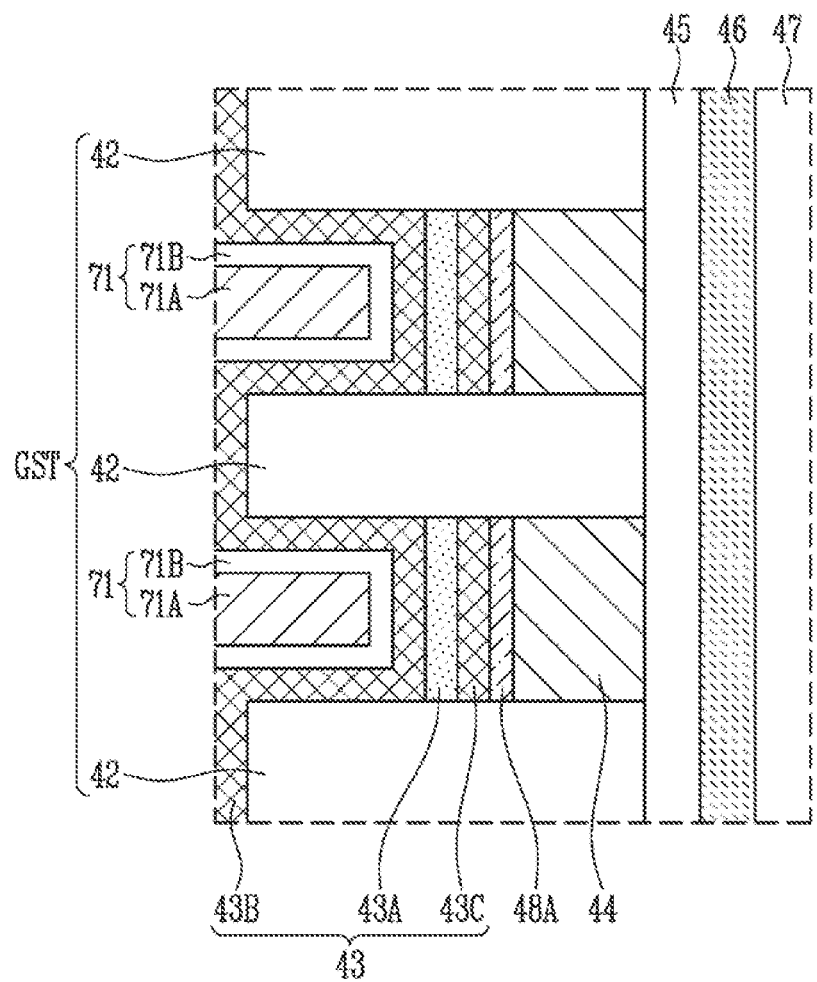

Referring to FIG. 4F, memory patterns 44 may be respectively formed in the second openings OP2, Subsequently, a tunnel insulating layer 45, a channel layer 46, and a core 47 may be formed in the first opening OP1, or some of the tunnel insulating layer 45, the channel layer 46, and the core 47 may be formed.

Subsequently, the first material layers 41 may be removed, and a second blocking pattern 43B may be formed. The second blocking pattern 43B may include a material with a dielectric constant that is higher than that of the first blocking patterns 43A. In an embodiment, the second blocking pattern 430B may include hafnium silicate (HfSiO$_x$). Accordingly, a blocking layer 43 may be formed, which includes the first blocking patterns 43A, the second blocking pattern 43B, and the third blocking patterns 43C. Subsequently, third material layers 71 may be respectively formed in third openings OP3 (see FIG. 3J). Each of the third material layers 71 may include a conductive pattern 71A and a barrier pattern 71B.

According to the manufacturing method described above, the metal patterns 48A are formed between the memory patterns 44 and the blocking layer 43, Thus, a leakage current can be reduced.

FIGS. 5A to 5G are views illustrating a manufacturing method of a semiconductor device in accordance with an embodiment of the present disclosure. Hereinafter, descriptions of portions overlapping with those described above will be omitted.

Figure 5A:
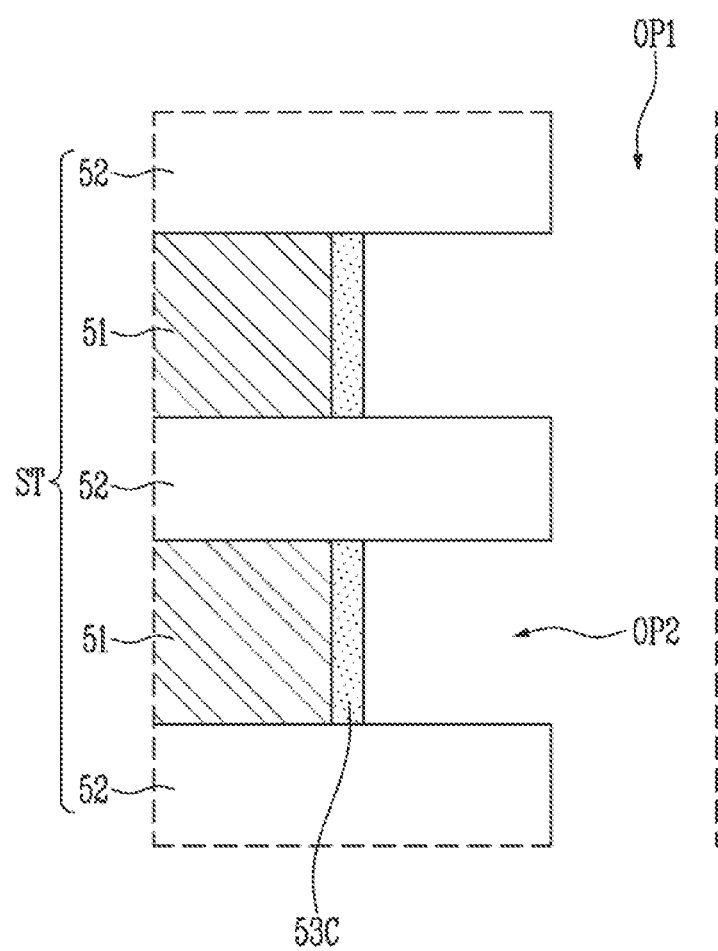
FIGS. 5A to 5G are views illustrating a manufacturing method of a semiconductor device in accordance with an embodiment of the present disclosure.

Referring to FIG. 5A, a stack structure ST is formed. The stack structure ST may include first material layers 51 and second material layers 52, which are alternately stacked. The first material layers 51 may include a material with a high etch selectivity with respect to the second material layers 52. In an example, the first material layers 51 may include a sacrificial material such as nitride, and the second material layers 52 may include an insulating material such as oxide. In another example, the first material layers 51 may include a conductive material such as poly-silicon, tungsten or molybdenum, and the second material layers 52 may include an insulating material such as oxide.

Subsequently, a first opening OP1 may be formed, which penetrates the stack structure ST. Subsequently, second openings OP2 may be formed by etching the first material layers 51, Subsequently, third blocking patterns 53C may be respectively formed in the second openings OP2, In an embodiment, the third blocking patterns 53C may be formed by oxidizing the first material layers 51 exposed through the second openings OP2. The third blocking patterns 53C may include oxide.

Referring to FIGS. 5B to 5E, first blocking patterns 53AB may be respectively formed in the second openings OP2. In an embodiment, the first blocking patterns 53AB may be respectively formed on surfaces of the third blocking patterns 53C, which are exposed through the second openings OP2.

Figure 5B:
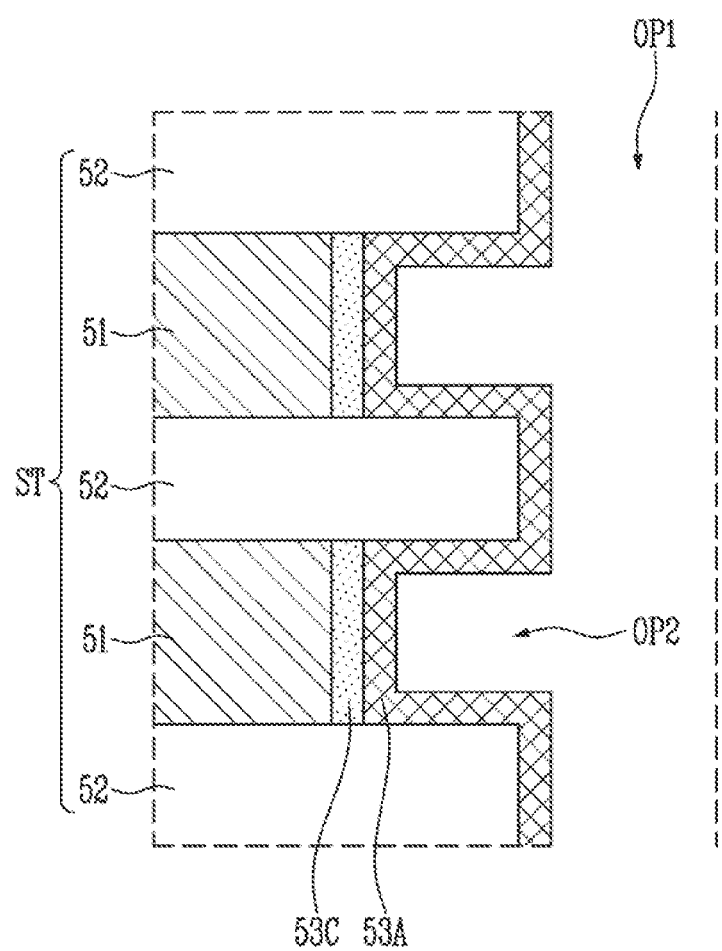

First, referring to FIG. 5B, a first blocking layer 53A is formed in the first opening OP1 and the second openings OP2. The first blocking layer 53A may be formed along surfaces of the second the second material layers 52 and the surfaces of the third blocking patterns 53C, which are exposed through the first opening OP1 and the second openings OP2. The first blocking layer 53A may include a material with a dielectric constant that is higher than that of the third blocking patterns 53C, In an embodiment, the first blocking layer 53A may include hafnium silicate (HfSiO$_x$).

Figure 5C:
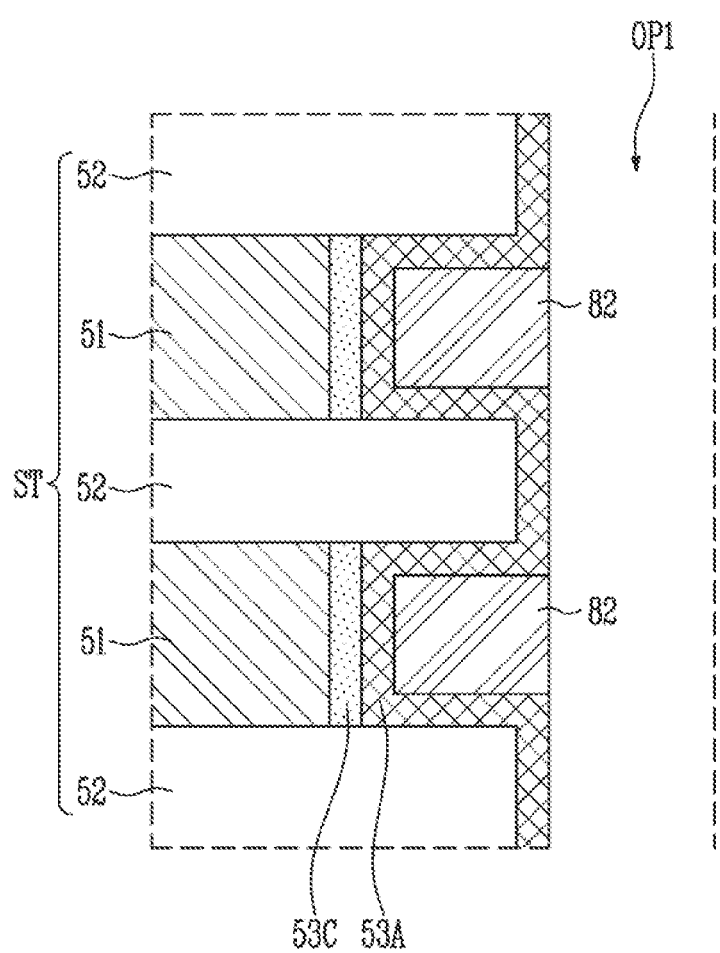

Referring to FIG. 5C, sacrificial layers 82 are respectively formed in the second openings OP2. The sacrificial layers 82 may include a material with a high etch selectivity with respect to the second materials layer 52 and the first blocking layer 53A. In an embodiment, the sacrificial layers 82 may include poly-silicon, tungsten, etc.

Figure 5D:
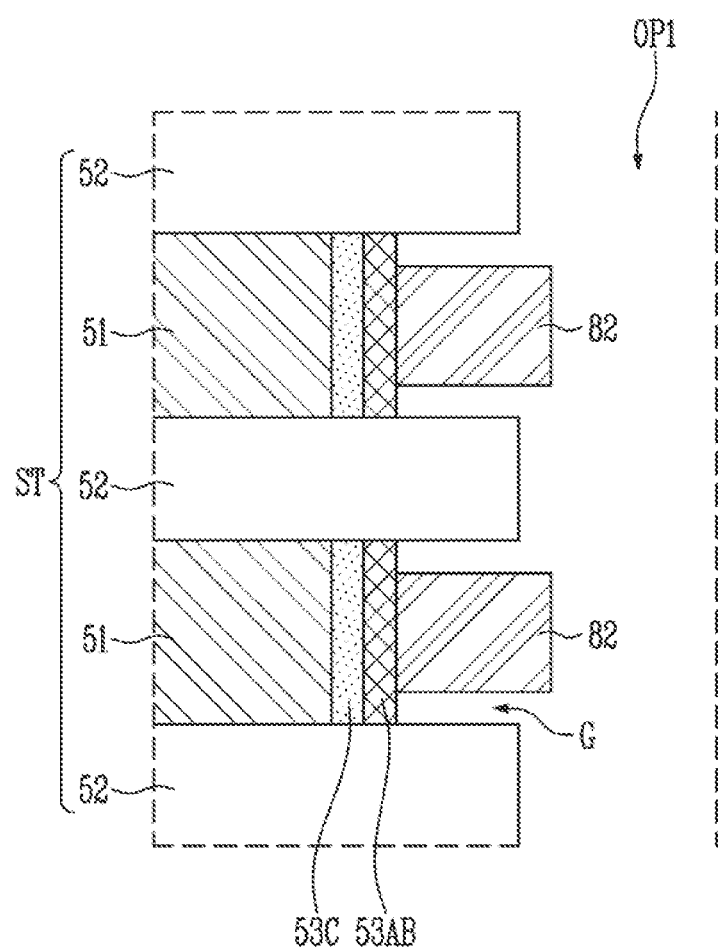

Referring to FIG. 5D, the first blocking patterns 53AB are formed. The first blocking patterns 53AB may be formed by selectively etching the first blocking layer 53A, Portions of the first blocking layer 53A, which are exposed by the sacrificial layers 82, may be etched, and portions located between the third blocking patterns 53C and the sacrificial layer 82 may remain. Accordingly, grooves G may be formed between the sacrificial layers 82 and the second material layers 52.

Figure 5E:
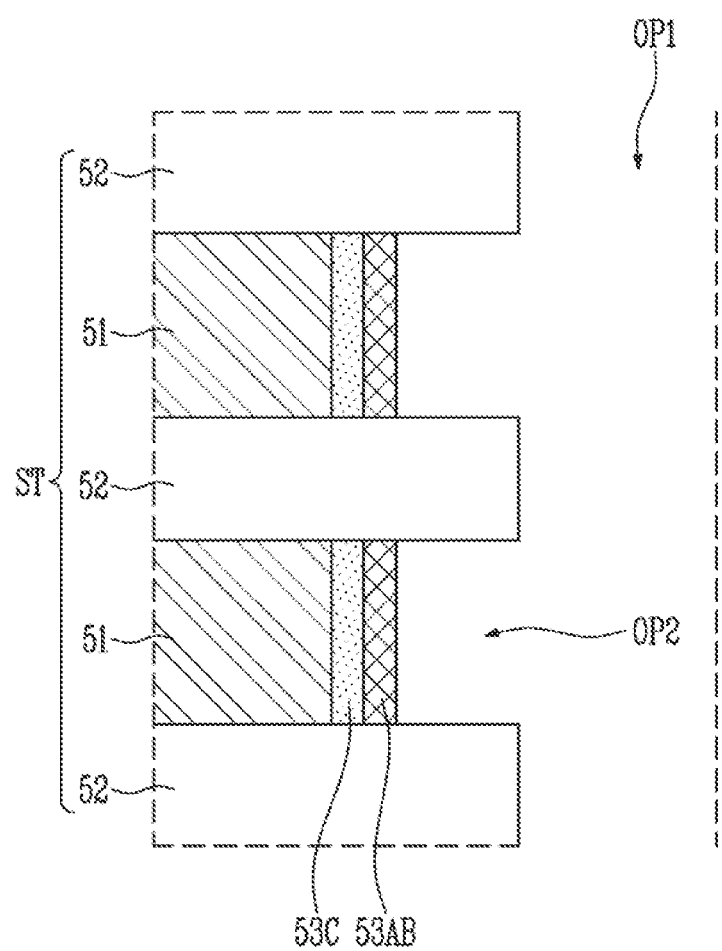

Referring to FIG. 5E, the sacrificial layers 82 are removed. The second openings OP2 may be again opened by selectively etching the sacrificial layers 82, The second material layers 52 and the first blocking patterns 53A may be exposed by the second openings OP2.

Figure 5F:
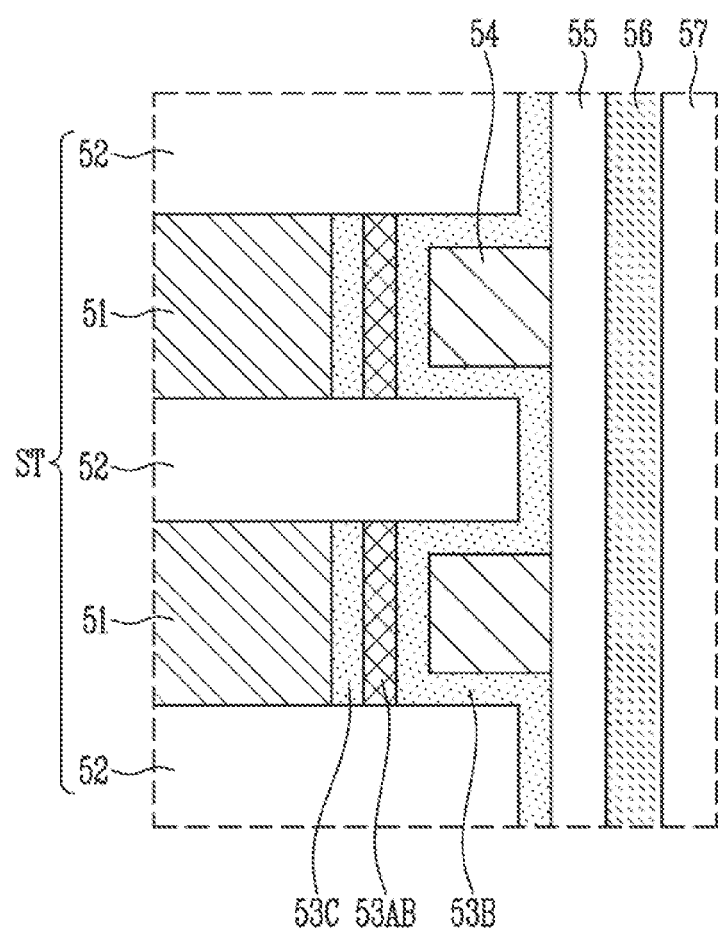

Referring to FIG. 5F, a second blocking pattern 53B is formed. The second blocking pattern 53B may be formed along inner surfaces of the first opening OP1 and the second openings OP2. The second blocking insulating layer 53B may include a material with a dielectric constant that is lower than that of the first blocking patterns 53AB. In an embodiment, the second blocking pattern 53B may include oxide. Accordingly, a blocking layer 53 may be formed, which includes the first blocking patterns 53AB, the second blocking pattern 53B, and the third blocking patterns 53C.

Subsequently, memory patterns 54 may be respectively formed in the second openings OP2. The memory patterns 54 may be surrounded by the second blocking pattern 53B. The memory patterns 54 may include a floating gate, a charge trap material, poly-silicon, nitride, a variable resistance material, a phase change material, and the like, or include a combination thereof. Subsequently, a tunnel insulating layer 55, a channel layer 56, and a core 57 may be formed in the first opening OP1, or some of the tunnel insulating layer 55, the channel layer 56, and the core 57 may be formed in the first opening OP1.

Metal patterns may be formed before the memory patterns 54 are formed. In an embodiment, the metal patterns may be formed through a selective deposition process or an etching process using sacrificial layers.

Figure 5G:
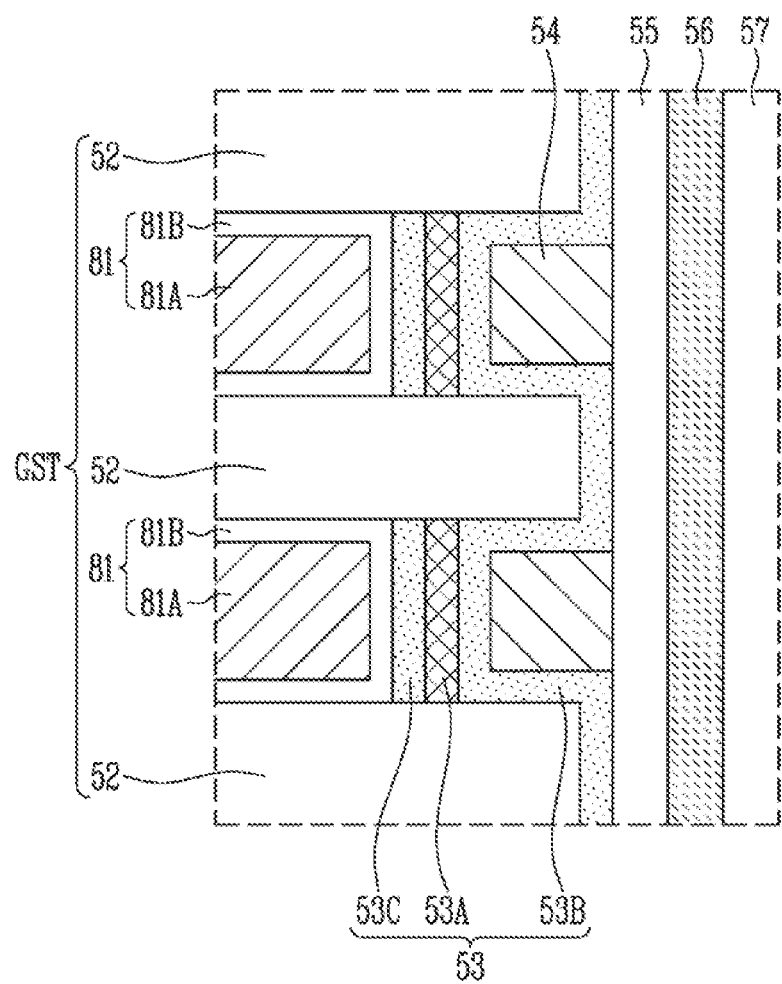

Referring to FIG. 5G, the first material layers 51 may be replaced with third material layers 81. In an example, when the first material layers 51 include a sacrificial material and the second material layers 52 include an insulating material, the first material layers 51 may be replaced with conductive layers. Each of the third material layers 81 may include a conductive pattern 81A and a barrier pattern 81B. In another example, when the first material layers 51 include a conductive material and the second material layers 52 include an insulating material, the first materials layer 51 may be silicided.

According to the manufacturing method described above, the blocking layer 53 including a high dielectric constant (high-k) material is formed. Thus, a gate coupling ratio can be increased. Also, the blocking layer 53 is formed not to be interposed between the third material layers 81 and the second material layers 52, Thus, the height of a gate structure GST can be decreased, and the degree of integration of the semiconductor device can be improved.

Figure 6:
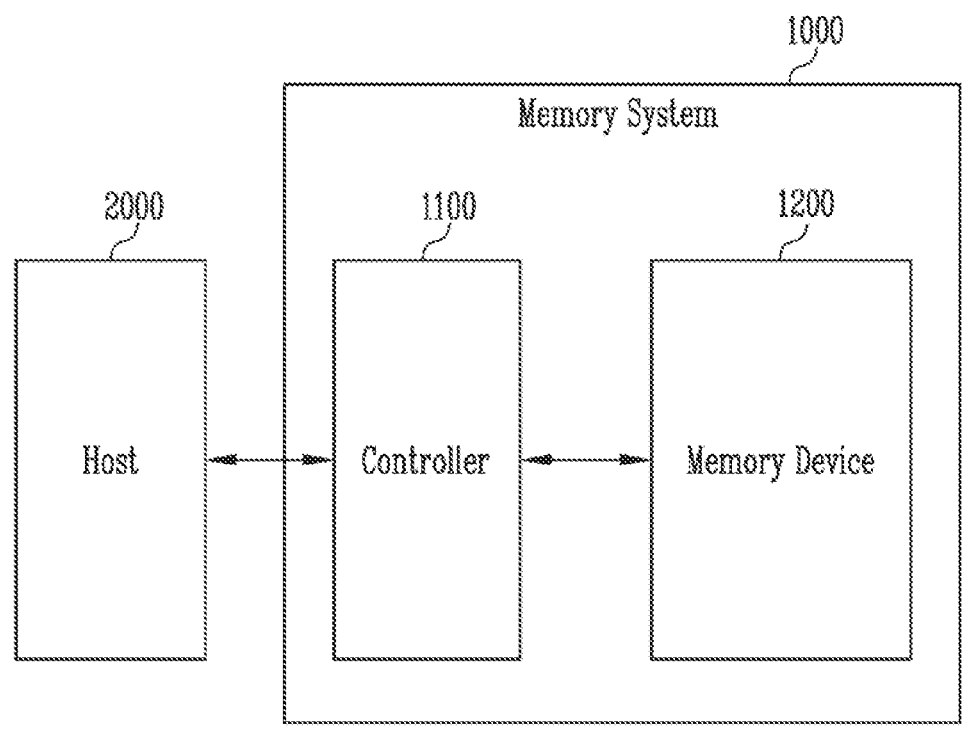
FIG. 6 is a diagram illustrating a memory system in accordance with an embodiment of the present disclosure.

FIG. 6 is a diagram illustrating a memory system in accordance with an embodiment of the present disclosure.

Referring to FIG. 6, the memory system 1000 may include a memory device 1200 configured to store data and a controller 1100 configured to communicate between the memory device 1200 and a host 2000.

The host 2000 may be a device or system which stores data in the memory system 1000 or retrieves data from the memory system 1000. The host 2000 may generate requests for various operations, and output the generated requests to the memory system 1000. The requests may include a program request for a program operation, a read request for a read operation, an erase request for an erase operation, and the like. The host 2000 may communicate with the memory system 1000 through various interfaces such as Peripheral Component Interconnect-Express (PCI-E), Advanced Technology Attachment (ATA), Serial ATA (SATA), Parallel ATA (DATA), Serial Attached SCSI (SAS), or Non-Volatile Memory Express (NVMe), a Universal Serial Bus (USB), a Multi-Media Card (MMC), an Enhanced Small Disk Interface (ESDI), and Integrated Drive Electronics (IDE).

The host 2000 may include at least one of a computer, a portable digital device, a tablet, a digital camera, a digital audio player, a television, a wireless communication device, and a cellular phone, but embodiments of the present disclosure are not limited thereto.

The controller 1100 may control overall operations of the memory system 1000, The controller 1100 may control the memory device 1200 according to a request of the host 2000. The controller 1100 may control the memory device 1200 to perform a program operation, a read operation, an erase operation, and the like according to a request of the host 2000. Alternatively, the controller 1100 may perform a background operation, etc. for improving the performance of the memory system 1000 without any request of the host 2000.

The controller 1100 may transmit a control signal and a data signal to the memory device 1200 so as to control an operation of the memory device 1200. The control signal and the data signal may be transmitted to the memory device 1200 through different input/output lines. The data signal may include a command, an address or data. The control signal may be used to distinguish a period in which the data signal is input.

The memory device 1200 may perform a program operation, a read operation, an erase operation, and the like under the control of the controller 1100. The memory device 1200 may be implemented with a volatile memory device in which stored data disappears when the supply of power is interrupted or a nonvolatile memory device in which stored data is retained even when the supply of power is interrupted. The memory device 1200 may be a semiconductor device with the structures described above with reference to FIGS. 1A to 2C, The memory device 1200 may be a semiconductor device manufactured by the manufacturing method described above with reference to FIGS. 3A to 3K, 4A to 4F, or 5A to 5G. In an embodiment, the semiconductor device may include: a gate structure including insulating layers and control gates, which are alternately stacked; a channel layer penetrating the gate structure; floating gates respectively located between the control gates and the channel layer; first blocking patterns respectively located between the control gates and the floating gates; and a second blocking pattern located between the first blocking patterns and the control gates and between the control gates and the insulating layers, the second blocking pattern including a material with a dielectric constant that is higher than that of the first blocking patterns.

Figure 7:
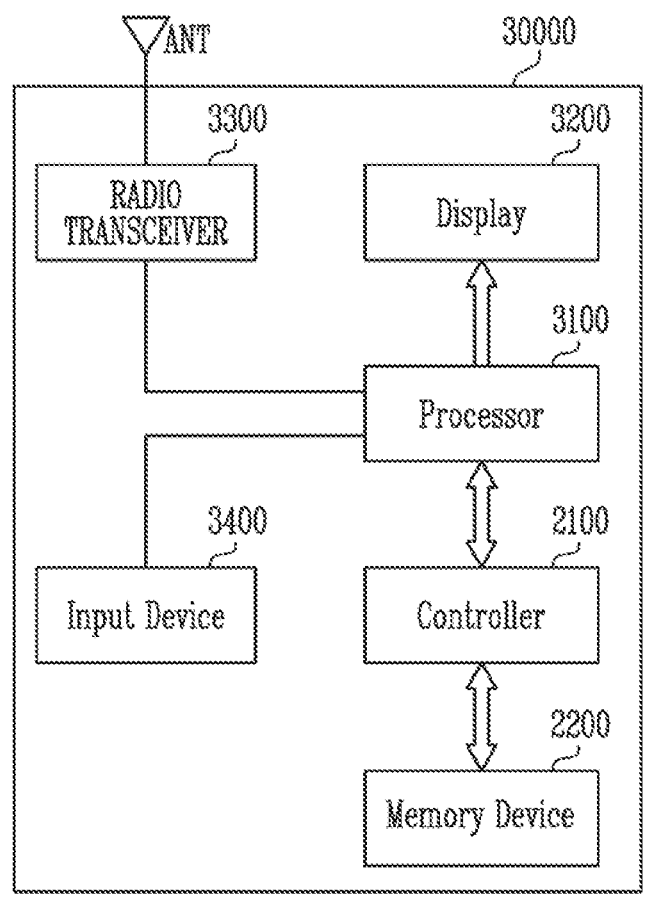
FIG. 7 is a diagram illustrating a memory system in accordance with an embodiment of the present disclosure.

FIG. 7 is a diagram illustrating a memory system in accordance with an embodiment of the present disclosure.

Referring to FIG. 7, the memory system 30000 may be implemented as a cellular phone, a smart phone, a tablet PC, a personal digital assistant (PDA), or a wireless communication device. The memory system 30000 may include a memory device 2200 and a controller 2100 capable of controlling an operation of the memory device 2200.

The controller 2100 may control a data access operation of the memory device 2200, e.g., a program operation, an erase operation, a read operation, or the like under the control of a processor 3100.

Data programmed in the memory device 2200 may be output through a display 3200 under the control of the controller 2100.

A radio transceiver 3300 may transmit/receive radio signals through an antenna ANT. For example, the radio transceiver 3300 may change a radio signal received through the antenna ANT into a signal that can be processed by the processor 3100. Therefore, the processor 3100 may process a signal output from the radio transceiver 3300 and transmit the processed signal to the controller 2100 or the display 3200. The controller 2100 may transmit the signal processed by the processor 3100 to the memory device 2200. Also, the radio transceiver 3300 may change a signal output from the processor 3100 into a radio signal, and output the changed radio signal to an external device through the antenna ANT. An input device 3400 is a device capable of inputting a control signal for controlling an operation of the processor 3100 or data to be processed by the processor 3100, and may be implemented as a pointing device such as a touch pad or a computer mouse, a keypad, or a keyboard. The processor 3100 may control an operation of the display 3200 such that data output from the controller 2100, data output from the radio transceiver 3300, or data output from the input device 3400 can be output through the display 3200.

In some embodiments, the controller 2100 capable of controlling an operation of the memory device 2200 may be implemented as a part of the processor 3100, or be implemented as a chip separate from the processor 3100.

Figure 8:
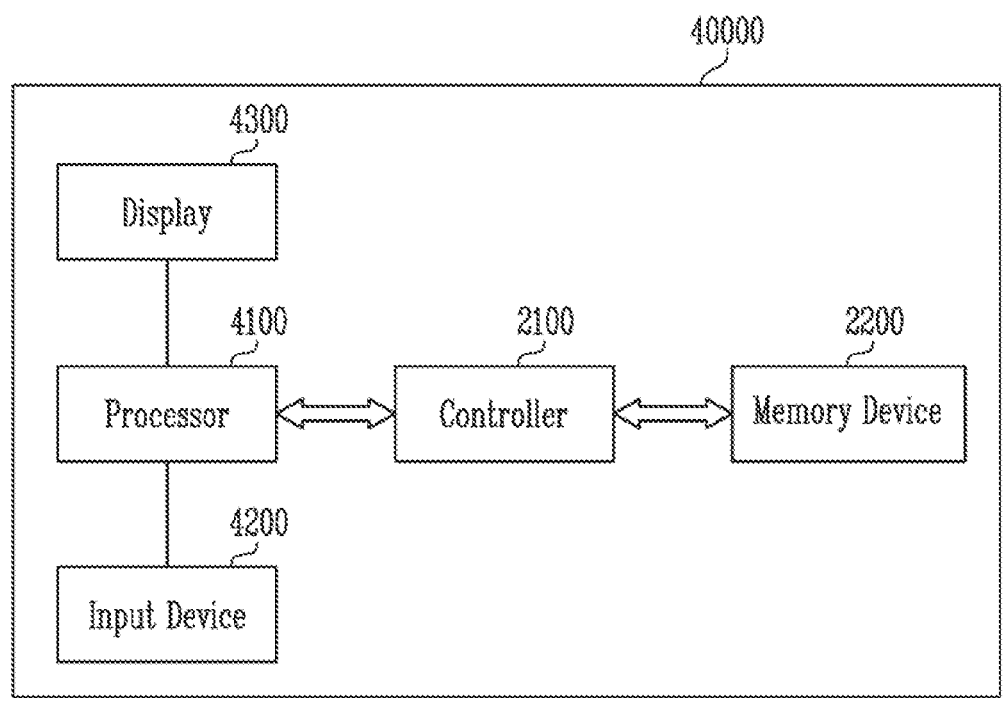
FIG. 8 is a diagram illustrating a memory system in accordance with an embodiment of the present disclosure.

FIG. 8 is a diagram illustrating a memory system in accordance with an embodiment of the present disclosure.

Referring to FIG. 8, the memory system 40000 may be implemented as a personal computer (PC), a tablet PC, a net-book, an e-reader, a personal digital assistant (PDA), a portable multi-media player (PMP), an MP3 player, or an MP4 player.

The memory system 40000 may include a memory device 2200 and a controller 2100 capable of controlling a data processing operation of the memory device 2200.

A processor 4100 may output data stored in the memory device 2200 through a display 4300 according to data input through an input device 4200. For example, the input device 4200 may be implemented as a pointing device such as a touch pad or a computer mouse, a keypad, or a keyboard.

The processor 4100 may control overall operations of the memory system 40000, and control an operation of the controller 2100. In some embodiments, the controller 2100 capable of controlling an operation of the memory device 2200 may be implemented as a part of the processor 4100, or be implemented as a chip separate from the processor 4100.

Figure 9:
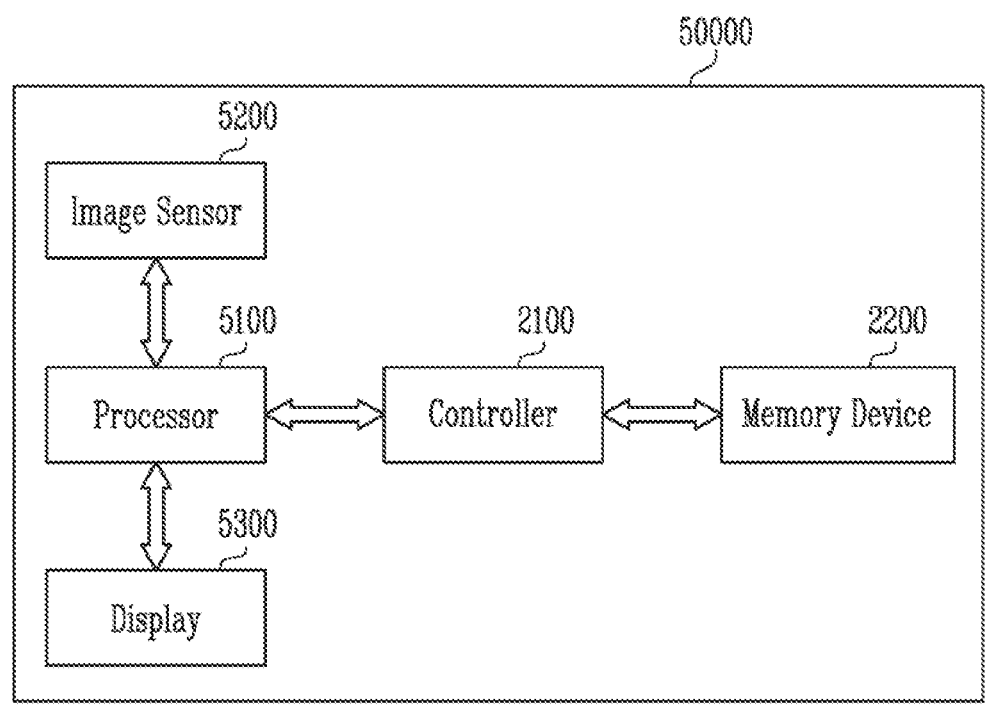
FIG. 9 is a diagram illustrating a memory system in accordance with an embodiment of the present disclosure.

FIG. 9 is a diagram illustrating a memory system in accordance with an embodiment of the present disclosure.

Referring to FIG. 9, the memory system 50000 may be implemented as an image processing device, e.g., a digital camera, a mobile terminal with a digital camera attached thereto, a smart phone with a digital camera attached thereto, or a tablet PC with a digital camera attached thereto.

The memory system 50000 may include a memory device 2200 and a controller 2100 capable of controlling a data processing operation of the memory device 2200, e.g., a program operation, an erase operation, or a read operation.

An image sensor 5200 of the memory system 50000 may convert an optical image into digital signals, and the converted digital signals may be transmitted to a processor 5100 or the controller 2100. Under the control of the processor 5100, the converted digital signals may be output through a display 5300, or be stored in the memory device 2200 through the controller 2100. In addition, data stored in the memory device 2200 may be output through the display 5300 under the control of the processor 5100 or the controller 2100.

In some embodiments, the controller 2100 capable of controlling an operation of the memory device 2200 may be implemented as a part of the processor 5100, or be implemented as a chip separate from the processor 5100.

Figure 10:
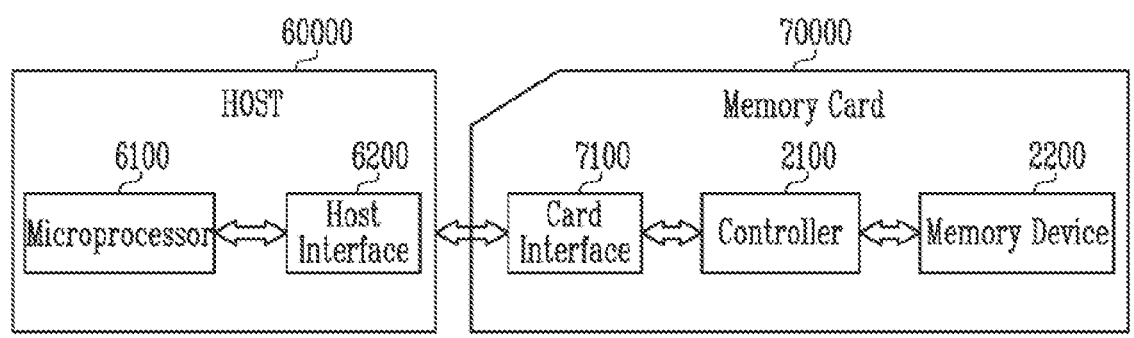
FIG. 10 is a diagram illustrating a memory system in accordance with an embodiment of the present disclosure.

FIG. 10 is a diagram illustrating a memory system in accordance with an embodiment of the present disclosure.

Referring to FIG. 10, the memory system 70000 may be implemented as a memory card or a smart card. The memory system 70000 may include a memory device 2200, a controller 2100, and a card interface 7100.

The controller 2100 may control data exchange between the memory device 2200 and the card interface 7100. In some embodiments, the card interface 7100 may be a secure digital (SD) card interface or a multi-media card (MMC) interface, but the present disclosure is not limited thereto.

The card interface 7100 may interface data exchange between a host 60000 and the controller 2100 according to a protocol of the host 60000. In some embodiments, the card interface 7100 may support a universal serial bus (USB) protocol and an inter-chip (IC)-USB protocol. The card interface 7100 may mean hardware capable of supporting a protocol used by the host 60000, software embedded in the hardware, or a signal transmission scheme.

When the memory system 70000 is connected to a host interface 6200 of the host 60000 such as a PC, a tablet PC, a digital camera, a digital audio player, a cellular phone, console video game hardware, or a digital set-top box, the host interface 6200 may perform data communication with the memory device 2200 through the card interface 7100 and the controller 2100 under the control of a microprocessor 6100.

In accordance with the present disclosure, memory cells are three-dimensionally stacked, so that the degree of integration of the semiconductor device can be improved. Further, the semiconductor device can have a stable structure and improved reliability.

The exemplary embodiments of the present disclosure have been described in the drawings and specification. Although specific terminologies are used here, those are only to explain the embodiments of the present disclosure, Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

So far as not being differently defined, all terms used herein including technical or scientific terminologies have meanings that they are commonly understood by those skilled in the art to which the present disclosure pertains. The terms with the definitions as defined in the dictionary should be understood such that they have meanings consistent with the context of the related technique, So far as not being clearly defined in this application, terms should not be understood in an ideally or excessively formal way.

What is claimed is:

1. A semiconductor device comprising:
   a gate structure including insulating layers and control gates, which are alternately stacked;
   a channel layer penetrating the gate structure;
   floating gates respectively located between the control gates and the channel layer;
   first blocking patterns respectively located between the control gates and the floating gates;
   a second blocking pattern located between the first blocking patterns and the floating gates and between the floating gates and the insulating layers, the second blocking pattern including a material with a dielectric constant that is lower than that of the first blocking patterns;
   third blocking patterns respectively located between the first blocking patterns and the control gates, the third blocking patterns including a material with a dielectric constant that is lower than that of the first blocking patterns; and
   metal patterns respectively located between the second blocking pattern and the floating gates and in direct contact with the floating gates,
   wherein each of the floating gates overlaps each of the insulating layers without the first blocking patterns and the third blocking patterns intervening, and
   wherein each of the control gates overlaps each of the insulating layers without the first blocking patterns and the third blocking patterns intervening.

2. The semiconductor device of claim 1, wherein the first blocking patterns include hafnium silicate ($HfSiO_x$).

3. The semiconductor device of claim 1, wherein the second blocking pattern includes oxide.

4. The semiconductor device of claim 1, wherein each of the control gates has a thickness thicker than that of each of the floating gates.

* * * * *